US012765408B2

(12) United States Patent
Huang et al.

(10) Patent No.: US 12,765,408 B2
(45) Date of Patent: Oct. 13, 2026

(54) METHOD OF MANUFACTURING AN INTERCONNECT STRUCTURE WITH A METAL CAP

(71) Applicant: Taiwan Semiconductor Manufacturing Company, Ltd., Hsinchu (TW)

(72) Inventors: Chun-Hsien Huang, Hsinchu (TW); Peng-Fu Hsu, Hsinchu (TW); Yu-Syuan Cai, Hsinchu (TW); Min-Hsiu Hung, Tainan City (TW); Chen-Yuan Kao, Zhudong Township (TW); Ken-Yu Chang, Hsinchu City (TW); Chun-I Tsai, Hsinchu City (TW); Chia-Han Lai, Zhubei City (TW); Chih-Wei Chang, Hsin-Chu (TW); Ming-Hsing Tsai, Hsin-Chu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/429,708

(22) Filed: Feb. 1, 2024

(65) Prior Publication Data

US 2024/0170381 A1 May 23, 2024

Related U.S. Application Data

(62) Division of application No. 17/200,024, filed on Mar. 12, 2021, now Pat. No. 11,929,314.

(51) Int. Cl.
*H10W 70/685* (2026.01)
*H10W 70/04* (2026.01)
(Continued)

(52) U.S. Cl.
CPC ....... *H10W 70/685* (2026.01); *H10W 70/042* (2026.01); *H10W 70/65* (2026.01); *H10W 72/352* (2026.01)

(58) Field of Classification Search
CPC ..... H01L 21/823475; H01L 21/823431; H01L 21/76879; H01L 27/0886; H01L 21/4828;
(Continued)

(56) References Cited

U.S. PATENT DOCUMENTS

| | | | |
|---|---|---|---|
| 6,495,452 | B1 | 12/2002 | Shih |
| 7,008,866 | B2 | 3/2006 | Huang et al. |

(Continued)

FOREIGN PATENT DOCUMENTS

| | | | |
|---|---|---|---|
| CN | 110783201 A | 2/2020 | |
| TW | 201725662 A | 7/2017 | |

(Continued)

*Primary Examiner* — Khiem D Nguyen
(74) *Attorney, Agent, or Firm* — Harrity & Harrity, LLP

(57) ABSTRACT

In some implementations, one or more semiconductor processing tools may form a metal cap on a metal gate. The one or more semiconductor processing tools may form one or more dielectric layers on the metal cap. The one or more semiconductor processing tools may form a recess to the metal cap within the one or more dielectric layers. The one or more semiconductor processing tools may perform a bottom-up deposition of metal material on the metal cap to form a metal plug within the recess and directly on the metal cap.

20 Claims, 21 Drawing Sheets

(51) Int. Cl.
*H10W 70/65* (2026.01)
*H10W 72/30* (2026.01)

(58) Field of Classification Search
CPC ......... H01L 23/49822; H01L 23/49838; H01L 24/29; H01L 21/76849; H01L 23/5283; H01L 2224/29184; H01L 23/49828; H10D 89/10; H10D 84/0135; H10D 84/0158; H10D 84/038; H10D 84/0149; H10D 84/834; H10W 10/685; H10W 10/042; H10W 10/65; H10W 70/685; H10W 70/042; H10W 70/65; H10W 20/435
See application file for complete search history.

(56) References Cited

U.S. PATENT DOCUMENTS

| | | | |
|---|---|---|---|
| 7,482,231 | B2 | 1/2009 | Lee et al. |
| 8,455,952 | B2 | 6/2013 | Lin et al. |
| 9,704,872 | B1 | 7/2017 | Huang |
| 9,721,889 | B1 | 8/2017 | Niu et al. |
| 9,947,669 | B1 | 4/2018 | Takesako et al. |
| 10,269,705 | B2 * | 4/2019 | Cheng ............... H01L 21/76895 |
| 10,790,363 | B2 | 9/2020 | Economikos et al. |
| 10,832,964 | B1 | 11/2020 | Xie et al. |
| 10,847,417 | B1 | 11/2020 | Yao et al. |
| 10,950,728 | B2 | 3/2021 | Chang et al. |
| 11,031,287 | B2 * | 6/2021 | Tapily ............... H01L 21/76816 |
| 11,121,299 | B2 | 9/2021 | Hu et al. |
| 11,171,053 | B2 | 11/2021 | Ching et al. |
| 11,282,790 | B1 * | 3/2022 | Liao .................. H01L 21/76849 |
| 11,469,139 | B2 | 10/2022 | Chen et al. |
| 2009/0298245 | A1 | 12/2009 | Doris et al. |
| 2011/0095427 | A1 | 4/2011 | Goswami et al. |
| 2013/0309829 | A1 * | 11/2013 | Fang .................... H10D 30/797 438/285 |
| 2015/0235948 | A1 | 8/2015 | Song et al. |
| 2016/0099326 | A1 | 4/2016 | Barnola et al. |
| 2016/0111515 | A1 | 4/2016 | Besser et al. |
| 2016/0118335 | A1 | 4/2016 | Lee et al. |
| 2016/0372413 | A1 | 12/2016 | Mahalingam et al. |
| 2017/0110397 | A1 * | 4/2017 | Wu ................... H01L 21/02282 |
| 2018/0082895 | A1 | 3/2018 | Pranatharthiharan et al. |
| 2018/0190504 | A1 | 7/2018 | Lee et al. |
| 2018/0254246 | A1 * | 9/2018 | Park .................. H01L 23/53209 |
| 2018/0308751 | A1 | 10/2018 | Wang et al. |
| 2019/0164748 | A1 * | 5/2019 | Chou .................. C23C 16/0272 |
| 2019/0259650 | A1 * | 8/2019 | Han .................. H01L 21/76865 |
| 2020/0058593 | A1 * | 2/2020 | Kelly ................ H01L 23/53209 |
| 2020/0098591 | A1 * | 3/2020 | Lin ................... H01L 21/76829 |
| 2020/0135872 | A1 | 4/2020 | Zang et al. |
| 2020/0258982 | A1 * | 8/2020 | Glass ................. H10D 30/6211 |
| 2020/0373410 | A1 | 11/2020 | Lee et al. |
| 2021/0082751 | A1 * | 3/2021 | Yang ................... H10W 20/037 |
| 2021/0249519 | A1 | 8/2021 | Yao et al. |
| 2022/0293503 | A1 | 9/2022 | Huang et al. |

FOREIGN PATENT DOCUMENTS

| | | | |
|---|---|---|---|
| TW | 201901859 | A | 1/2019 |
| TW | 201924048 | A | 6/2019 |
| TW | 202018765 | A | 5/2020 |

* cited by examiner

800

METHOD OF MANUFACTURING AN INTERCONNECT STRUCTURE WITH A METAL CAP

RELATED APPLICATION

This application is a divisional of U.S. patent application Ser. No. 17/200,024, filed Mar. 12, 2021, issued as U.S. Pat. No. 11,929,314, which is incorporated herein by reference in its entirety.

BACKGROUND

A semiconductor device may include a transistor configured to receive a voltage and perform an operation based on reception of the voltage. To receive the voltage, the transistor may be coupled to a voltage line using one or more interconnects, such as a contact feature. Semiconductor device manufacturers have attempted to produce smaller and more complex semiconductor devices to improve performance, reduce power consumption, and/or conserve valuable space for deployment in an electronic device. For example, semiconductor device manufacturers have attempted to reduce a width of metal gates and interconnects, such as contact features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
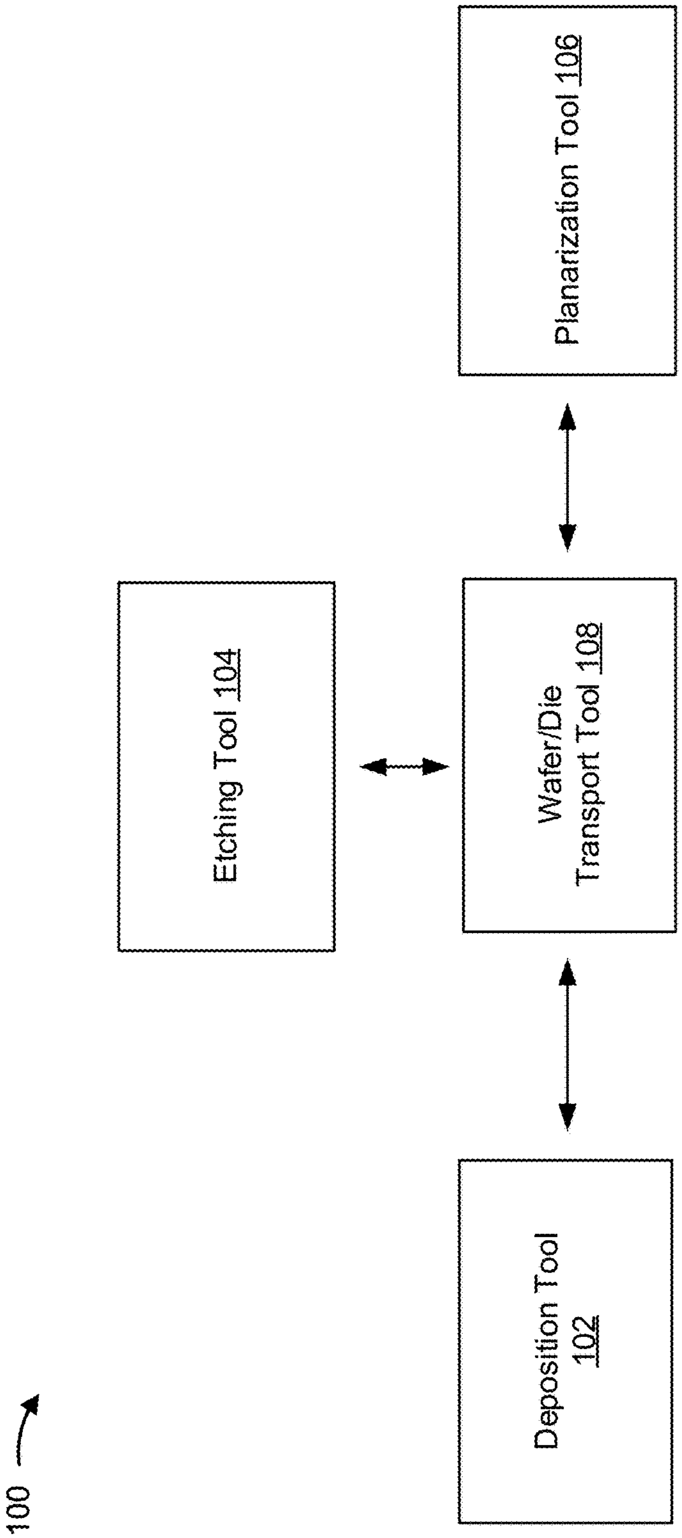
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a contact feature may be used to provide a connection to a metal gate through a recess of a dielectric material. In some embodiments, the contact feature is a plug-type structure having a circle or an oval shape with respect to a top view. In some embodiments, the contact feature is a trench-type structure with an oval or substantially rectangular shape with respect to a top view. A metal liner and/or a barrier layer (e.g., titanium or titanium nitride, among other examples) may be disposed within the recess before deposition of metal material to form the metal plug within the recess. However, some semiconductor devices may be formed with narrow dimensions such that an aspect ratio of the dimension that is filled with the metal liner and/or the barrier layer causes increased resistivity and may cause the formation of voids within the tungsten material.

Some implementations described herein provide techniques and apparatuses for forming a semiconductor device including a bottom-up metal-on-metal deposited metal plug within a recess. For example, the metal plug may be deposited directly on a metal cap of a metal gate. In some implementations, one or more semiconductor processing devices may deposit the metal plug directly on the metal cap of the metal gate using area-selective thin film deposition. In some implementations, the area-selective thin film deposition may include a chemical vapor deposition and/or an atomic layer deposition to deposit the metal plug, layer-by-layer, on the metal gate.

Based on using bottom-up metal-on-metal deposition of the metal plug within the recess, the recess may be filled with the metal plug without the need for a metal liner and/or a barrier layer. Additionally, or alternatively, the metal plug may be formed without voids or with reduced voids. In this way, a width of the recess may be decreased (e.g., to less than 13 nanometers) while maintaining a sufficient width of metal plug material to maintain a relatively low resistivity of an interface between the metal plug and the metal gate. Further, a manufacturing timing and/or cost may be reduced based on not depositing the metal liner and/or the barrier layer.

FIG. 1 is a diagram of an example environment 100 in which systems and/or methods described herein may be implemented. As shown in FIG. 1, environment 100 may include a plurality of semiconductor processing tools 102-106 and a wafer/die transport tool 108. The plurality of semiconductor processing tools 102-106 may include a deposition tool 102, an etching tool 104, a planarization tool 106, and/or another type of semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotopically or directionally etch the one or more portions), or another type of dry etching technique.

The etching tool 104 (e.g., a dry etching tool) may perform an etching operation until detecting a contact etch stop layer (CESL) of the wafer or semiconductor device. Detection of the CESL may indicate that the etching operation is complete. The etching tool 104 may perform a subsequent etching operation and/or the wafer/die transport tool 108 may transport the wafer or semiconductor device from the etching tool 104 to another semiconductor processing tool after the etching operation is complete.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool 106 that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The wafer/die transport tool 108 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-106 and/or to and from other locations such as a wafer rack, a storage room, or another location. In some implementations, the wafer/die transport tool 108 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
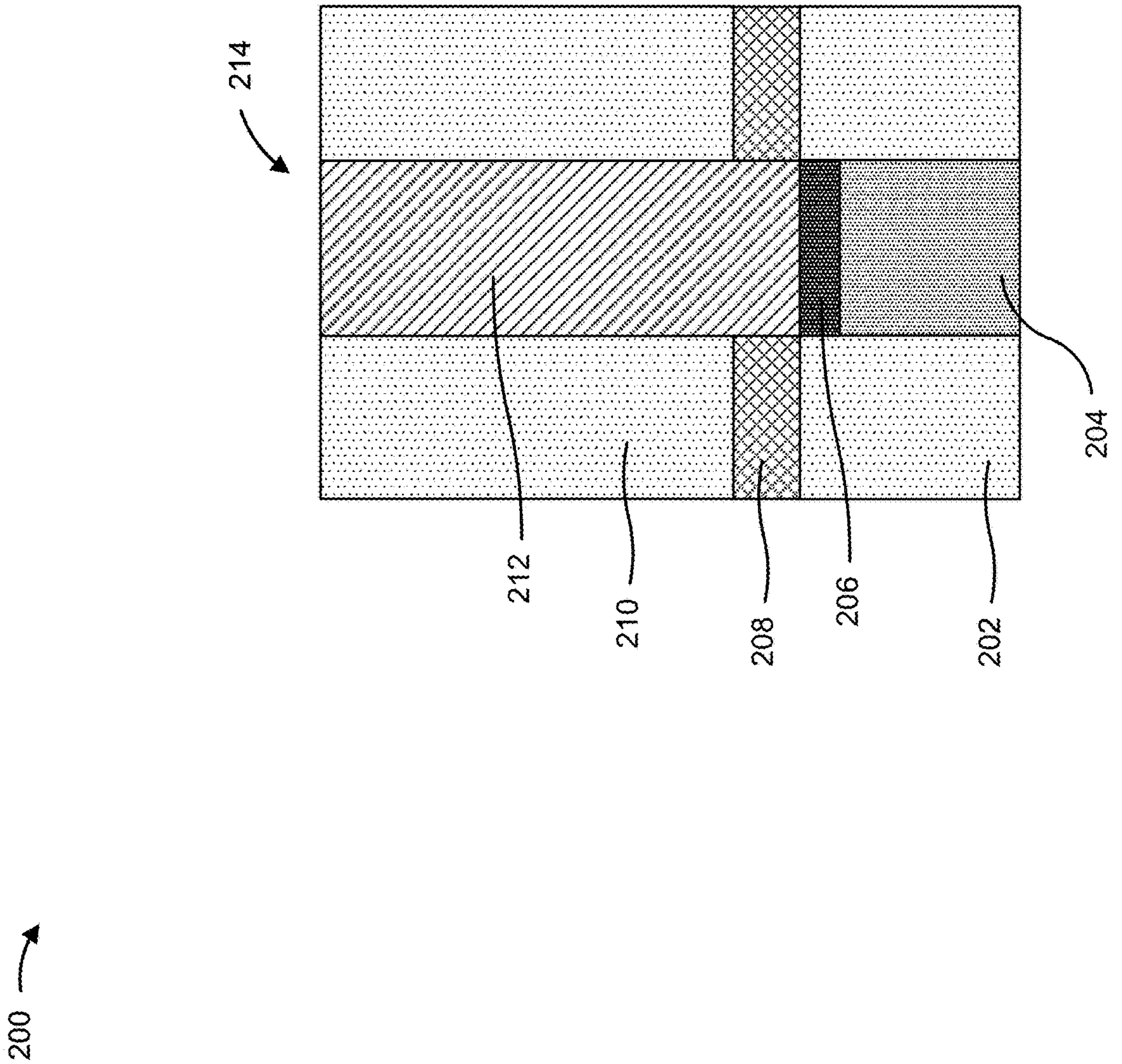
FIG. 2 is a diagram of an example semiconductor device described herein.

FIG. 2 is a diagram of an example semiconductor device 200 described herein. The semiconductor device 200 may include, or may be included in, a memory device (e.g., a static random-access memory cell) or a logic device, among other example devices. In some implementations, the semiconductor device 200 may include one or more layers not shown in FIG. 2, such as one or more metal gates, a substrate, one or more metal interconnects, one or more recesses, or one or more additional semiconductor devices, among other examples.

As shown in FIG. 2, the semiconductor device 200 may include a first dielectric layer 202. The first dielectric layer 202 may include a silicon oxide-based material (e.g., SiOx, where x is between 1 and 2). The first dielectric layer 202 may include a recess having a first conductive structure 204 disposed therein. In some embodiments, the first conductive structure 204 is a gate structure of a field effect transistor. In some embodiments, the first conductive structure 204 is a source/drain structure of the field effect transistor. In some implementations, the first conductive structure 204 may include at least one of aluminum, tantalum, titanium, niobium, tungsten, silicon, and hafnium. In some implementations, the first dielectric layer 202 may include a fin structure that extends along a first direction (e.g., shown as a lateral direction in FIG. 2). In some implementations, the first conductive structure 204 may be disposed over the fin structure and may extend along a second direction, with the second direction being approximately perpendicular to the first direction (e.g., shown as a vertical direction in FIG. 2).

A metal cap 206 may also be disposed within the recess and on the first conductive structure 204. The metal cap 206 may substantially overlap an entire top surface of the first conductive structure 204. In some implementations, the metal cap 206 may include a titanium-based material, a cobalt-based material, a nickel-based material, a ruthenium-based material, a tantalum-based material, a tungsten-based material, and/or a platinum-based material. In some implementations, the metal cap 206 may reduce electromigration between the first conductive structure 204 and one or more materials that may be formed on the first conductive structure 204, such as a metal material and/or a dielectric material.

The semiconductor device 200 may include a second dielectric layer 208 disposed on the first dielectric layer 202 and on the metal cap 206 (e.g., on upper surfaces of the first dielectric layer 202 and the metal cap 206). The semiconductor device 200 may include a third dielectric layer 210 disposed on the second dielectric layer 208 (e.g., on an upper surface of the second dielectric layer 208). In some implementations, the second dielectric layer 208 may include a silicon nitride-based material. In some implementations, the second dielectric layer 208 may form a contact etch stop layer for a manufacturing process. In some implementations, the third dielectric layer 210 may include a silicon oxide-based material (e.g., SiO2). In some implementations, the third dielectric layer 210 may be formed from a same material used to form the first dielectric layer 202.

A second conductive structure 212 may be disposed within a recess 214 of the second dielectric layer 208 and the third dielectric layer 210. The second conductive structure 212 may include a tungsten-based structure. In some implementations, a concentration of tungsten at a lower portion of the second conductive structure 212 is smaller than that at an upper portion of the second conductive structure 212. The second conductive structure 212 may be disposed on the first conductive structure 204 (e.g., directly on the first conductive structure 204 or indirectly on the first conductive structure through the metal cap 206). In some implementations, sidewalls of the second conductive structure 212 may be in direct contact with the second dielectric layer 208 and/or the third dielectric structure (collectively, a dielectric structure). The recess 214 may be disposed within the second dielectric layer 208 and the third dielectric layer 210 from an upper surface of the third dielectric layer 210 to the metal cap 206. In this way, the recess 214 may facilitate the second conductive structure 212 extending from the third dielectric layer 210 to the metal cap 206.

The second conductive structure 212 may be disposed directly on the metal cap 206 and/or directly on sidewalls of the recess 214. In some implementations, the second conductive structure 212 may be deposited within the recess 214 without a metal liner (e.g., a titanium-based liner) and/or without a barrier layer (e.g., a titanium nitride-based liner). For example, the second conductive structure 212 may be in direct contact with the second dielectric layer 208 and/or the third dielectric layer 210. For example, the recess 214 may be completely filled (or substantially completely filled) with the metal plug material. The second conductive structure 212 may be formed without nucleation layers based on forming the second conductive structure 212 using bottom-up metal-on-metal deposition (e.g., instead of a bulk fill deposition). In some implementations, the second conductive structure 212 may include a tungsten-based material, a cobalt-based material, a copper-based material, a titanium-based material, or a platinum-based material, among other examples.

Based in part on the second conductive structure 212 being disposed directly on the metal cap 206 and/or directly on sidewalls of the recess 214, the recess 214 may include a higher fraction, a higher percentage, and/or a higher density of metal plug material. Additionally, or alternatively, the second conductive structure 212 may reduce, or eliminate, voids and/or nucleation layers based on forming the second conductive structure 212 using bottom-up metal-on-metal deposition. In this way, the second conductive structure 212 may have a reduced resistance (e.g., a contact resistance with the metal cap 206 and/or the first conductive structure 204). Further, the recess 214 may have a reduced width without causing the second conductive structure 212 to have a relatively high resistance that would consume power resources and/or render the semiconductor device 200 inoperable (e.g., impractical to operate).

As indicated above, FIG. 2 is provided as an example. Other examples may differ from what is described with regard to FIG. 2.

FIGS. 3A-3K are diagrams of an example implementation 300 described herein. Example implementation 300 may be an example process for forming a semiconductor device 200. The semiconductor device 200 may include a memory device (e.g., a static random-access memory cell) or a logic device, among other example devices.

Figure 3A:
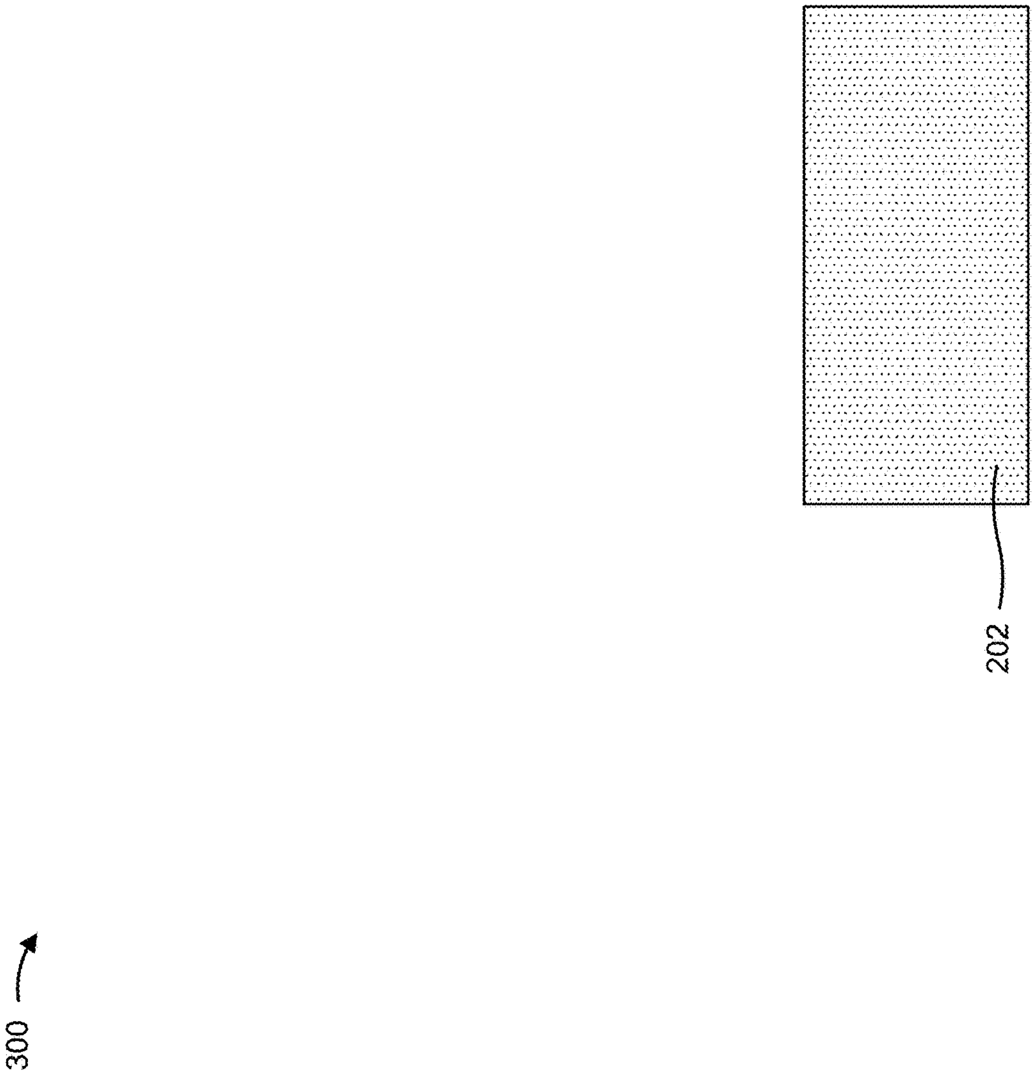
FIGS. 3A-3K are diagrams of an example implementation described herein.

As shown in FIG. 3A, the semiconductor device 200 may include a first dielectric layer 202. In some implementations, a deposition tool (e.g., deposition tool 102) may deposit the first dielectric layer 202 on a substrate or another layer of the semiconductor device 200. In some implementations, the deposition tool may use chemical vapor deposition or physical vapor deposition, among other examples, to deposit the first dielectric layer 202 onto the substrate or the other layer of the semiconductor device 200. For example, the deposition tool may deposit the first dielectric layer 202 on an active region of the semiconductor device 200 (e.g., a doped portion of the substrate or the other layer of the semiconductor device 200).

In some implementations, a planarization tool (e.g., planarization tool 106) may planarize an upper surface of the first dielectric layer 202 after deposition. In this way, the upper surface of the first dielectric layer 202 may be generally planar. However, dishing may occur after planarizing the upper surface of the first dielectric layer 202.

Figure 3B:
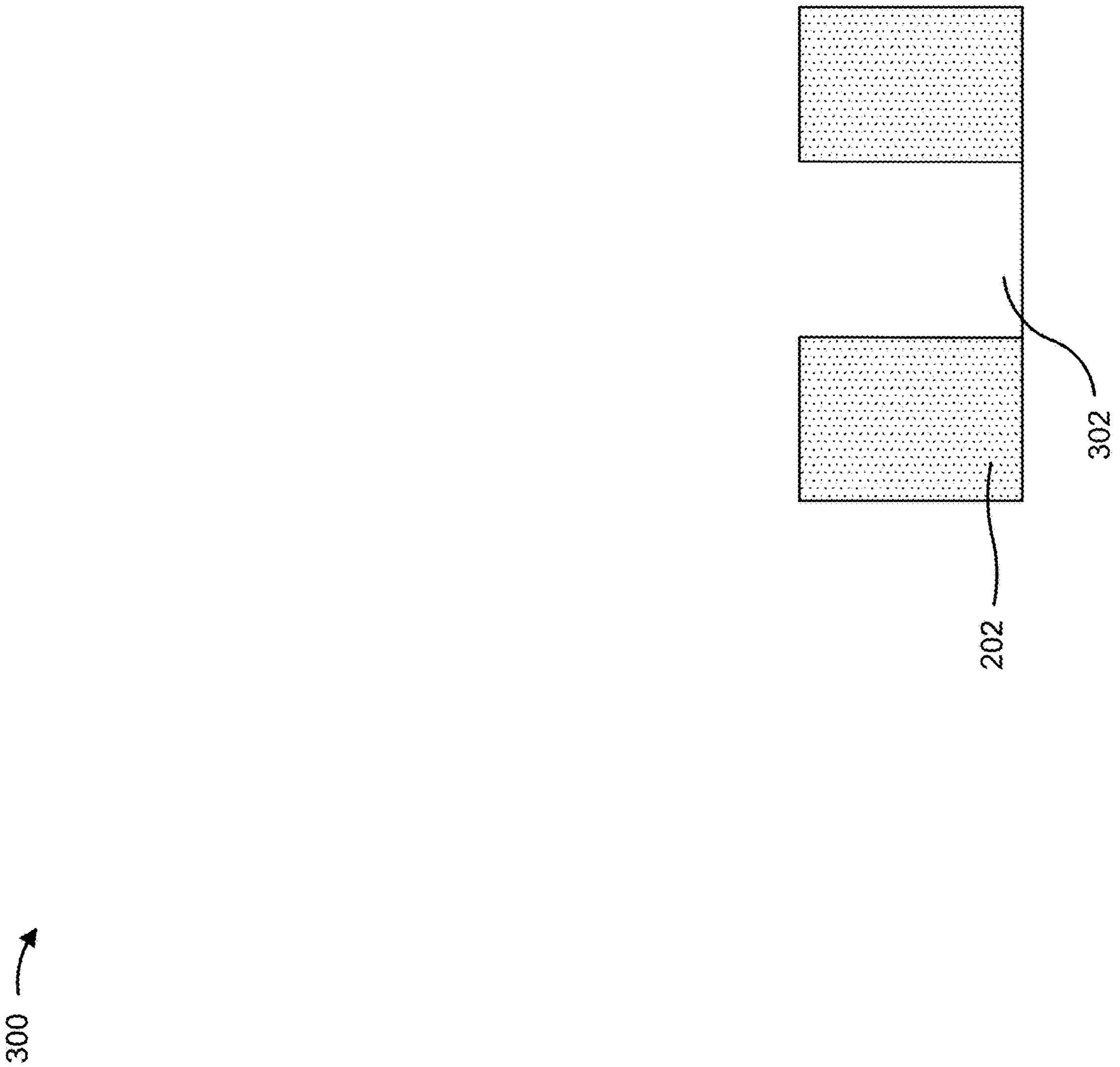

As shown in FIG. 3B, the semiconductor device 200 may include a recess 302 within the first dielectric layer 202. In some implementations, an etching tool (e.g., etching tool 104) may etch a portion of the first dielectric layer 202 to form the recess 302. For example, the etching tool may use a wet etching operation, a dry etching operation, and/or another type of etching operation to form the recess 302 within the first dielectric layer 202.

Figure 3C:
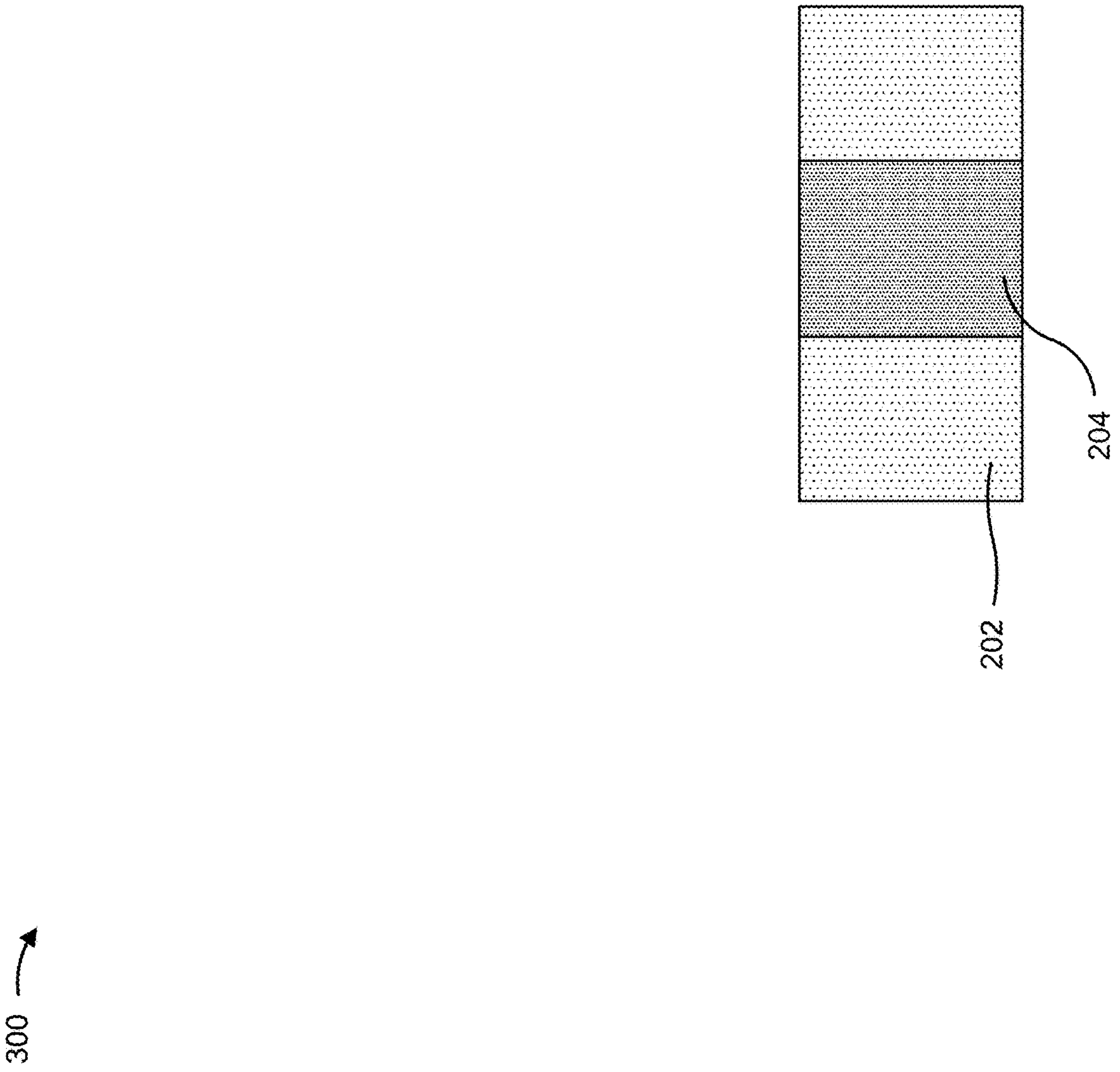

As shown in FIG. 3C, the semiconductor device 200 may include a first conductive structure 204. In some implementations, a deposition tool (e.g., deposition tool 102) may deposit the first conductive structure 204 within the recess 302 formed within the first dielectric layer 202. In some implementations, the deposition tool may use chemical vapor deposition or physical vapor deposition, among other examples, to deposit metal material for the first conductive structure 204 within the recess 302 formed within the first dielectric layer 202. For example, the deposition tool may deposit the metal material within the recess 302 formed within the first dielectric layer 202 and on a surface of a tunneling oxide or another dielectric layer of a transistor of the semiconductor device 200.

In some implementations, a planarization tool (e.g., planarization tool 106) may planarize an upper surface of the first conductive structure 204. However, dishing may occur after planarizing the upper surface of the first conductive structure 204 such that the upper surface of the first conductive structure 204 may have a generally concave shape.

Figure 3D:
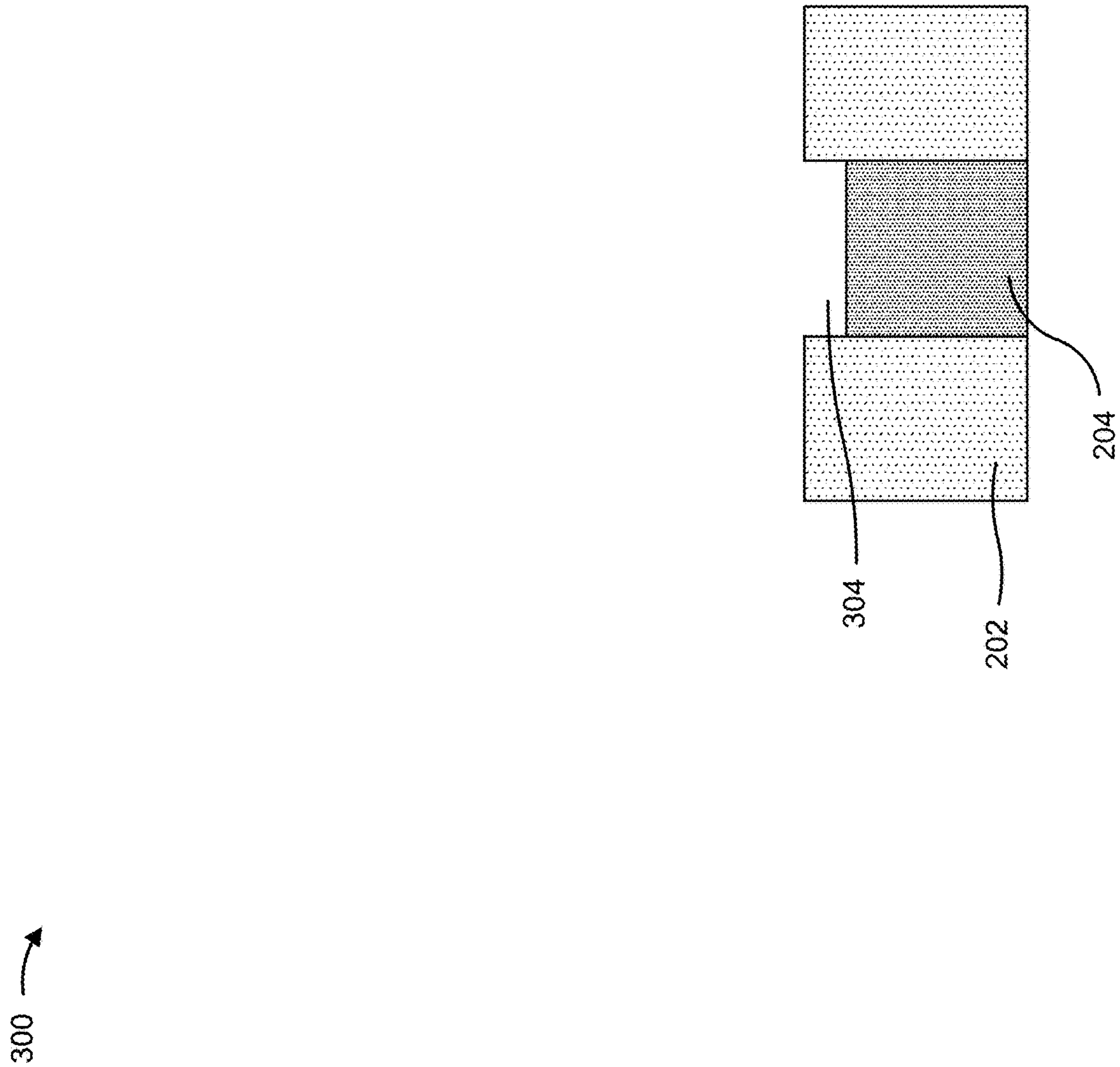

As shown in FIG. 3D, the semiconductor device 200 may include a recess 304 within the first dielectric layer 202 and on the first conductive structure 204. In some implementations, an etching tool (e.g., etching tool 104) may etch a portion of the first conductive structure 204 to form the recess 304. For example, the etching tool may use a wet etching operation, a dry etching operation, and/or another type of etching operation to form the recess 304 within the first conductive structure 204. Alternatively, the semiconductor device 200 may include the recess 304 within the first dielectric layer 202 based on only partially filling the recess 302 with the first conductive structure 204 (e.g., partially filling the recess 302 with the metal material for the first conductive structure 204 and leaving the recess 304 on top of the first conductive structure 204).

In some implementations, an upper surface of the first conductive structure 204 may have a generally concave shape. For example, the first conductive structure 204 may have a generally concave shape based on effects of performing an etching operation to form the recess 304.

Figure 3E:
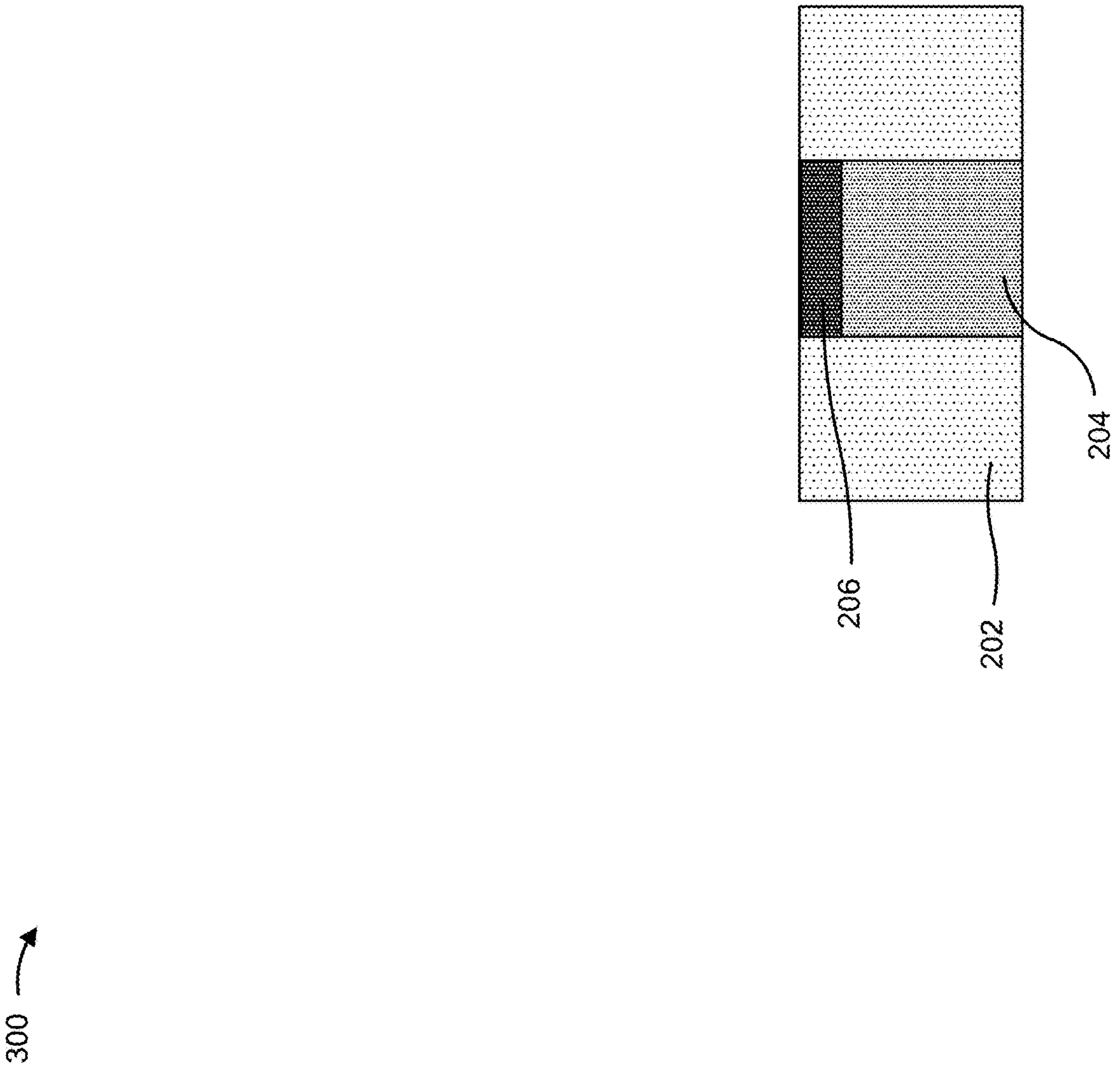

As shown in FIG. 3E, the semiconductor device 200 may include a metal cap 206. In some implementations, a deposition tool (e.g., deposition tool 102) may deposit metal material for the metal cap 206 on the first conductive structure 204 within the recess 304 formed within the first dielectric layer 202. In some implementations, the deposition tool may use chemical vapor deposition or physical vapor deposition, among other examples, to deposit the metal cap 206 on the first conductive structure 204.

In some implementations, a planarization tool (e.g., planarization tool 106) may planarize an upper surface of the metal cap 206. However, dishing may occur after planarizing the upper surface of the metal cap 206 such that the upper surface of the metal cap 206 may have a generally concave shape. Additionally, or alternatively, the upper surface of the metal cap 206 may have a generally concave shape based on the upper surface of the first conductive structure 204 having a generally concave shape.

Figure 3F:
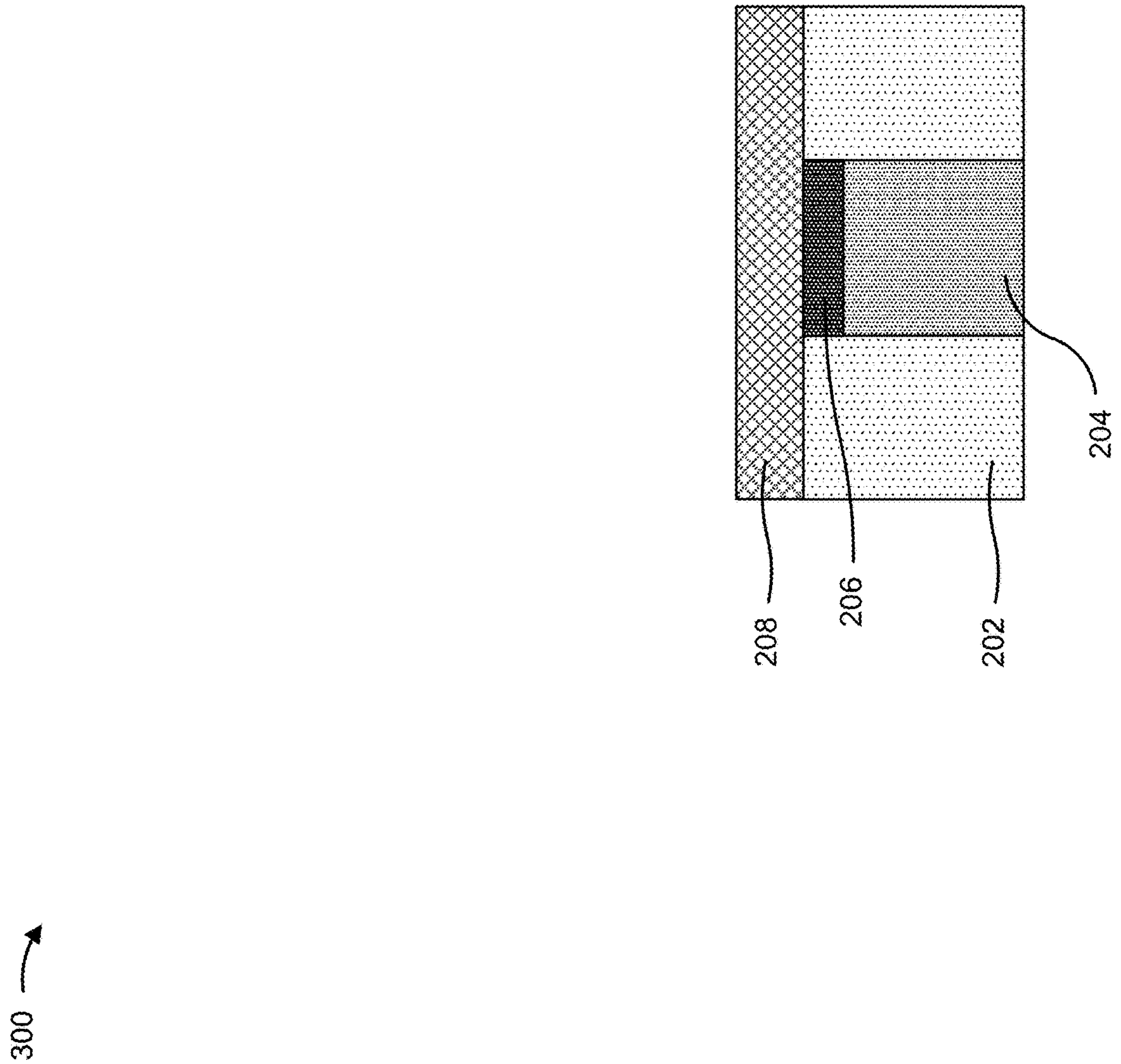

As shown in FIG. 3F, the semiconductor device 200 may include a second dielectric layer 208. In some implementations, a deposition tool (e.g., deposition tool 102) may deposit the second dielectric layer 208 on the first dielectric layer 202 and on the metal cap 206 (e.g., on upper surfaces of the first dielectric layer 202 and the metal cap 206). In some implementations, the deposition tool may use chemical vapor deposition or physical vapor deposition, among other examples, to deposit the second dielectric layer 208 on the first dielectric layer 202 and on the metal cap 206.

In some implementations, the deposition tool may perform multiple deposition operations to deposit the second dielectric layer 208. For example, the deposition tool may deposit a first portion of the second dielectric layer 208. A planarization tool (e.g., planarization tool 106) may planarize an upper surface of the first portion of the second dielectric layer 208. In this way, an upper surface of the first portion of the second dielectric layer 208 may be generally level (e.g., even though an upper surface of the metal cap 206 may have a generally concave shape). The deposition tool may deposit a second portion of the second dielectric layer 208 after planarizing the upper surface of the first portion of the second dielectric layer 208. The planarization tool may planarize an upper surface of the second portion of the second dielectric layer 208. In this way, an upper surface of the second portion of the second dielectric layer 208 may be generally level.

Figure 3G:
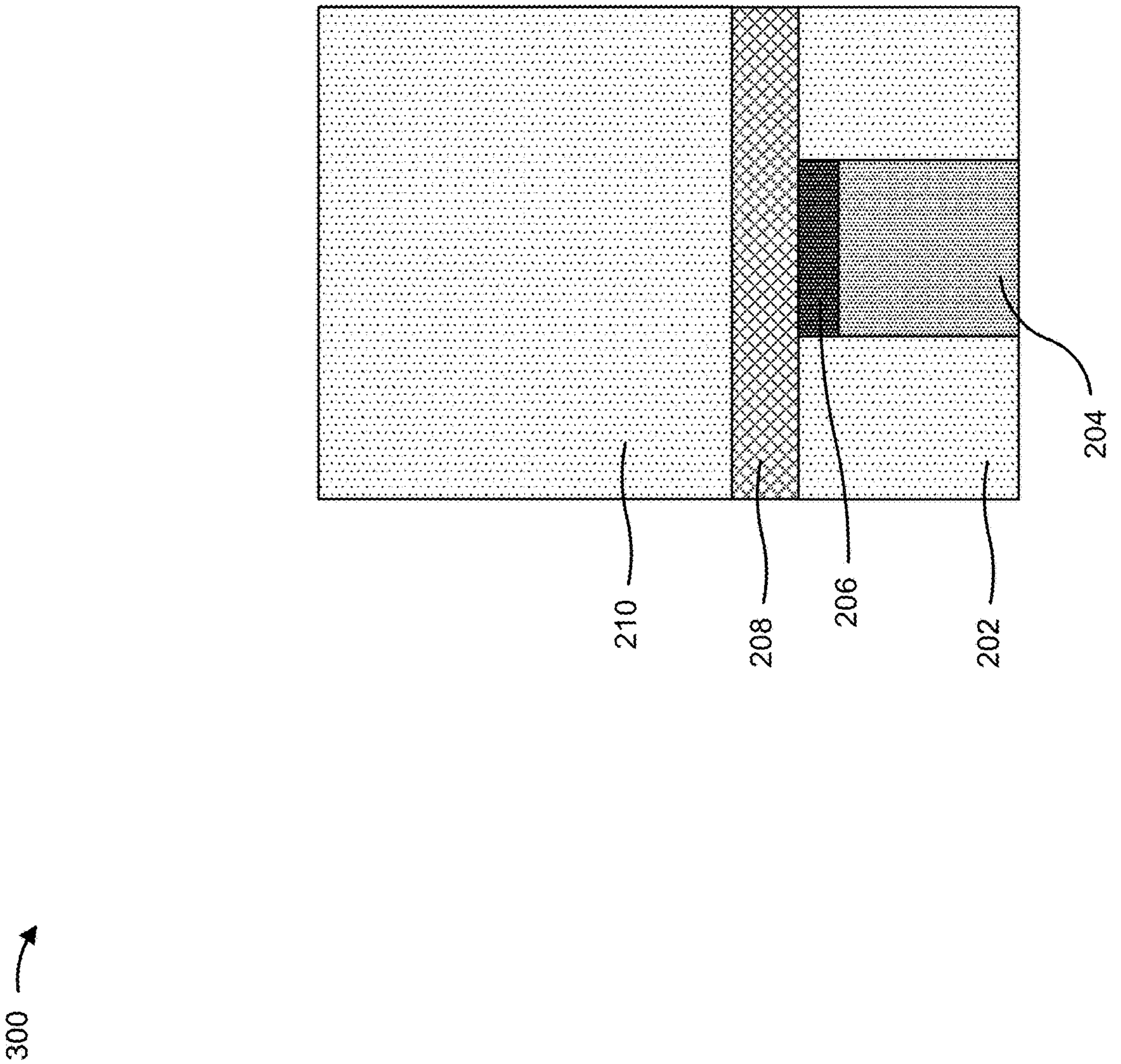

As shown in FIG. 3G, the semiconductor device 200 may include a third dielectric layer 210. In some implementations, a deposition tool (e.g., deposition tool 102) may deposit the third dielectric layer 210 on the second dielectric layer 208 (e.g., on an upper surface of the second dielectric layer 208). In some implementations, the deposition tool may use chemical vapor deposition or physical vapor deposition, among other examples, to deposit the third dielectric layer 210 on the second dielectric layer 208.

In some implementations, a planarization tool (e.g., planarization tool 106) may planarize an upper surface of the third dielectric layer 210. In this way, an upper surface of the third dielectric layer 210 may be generally level.

Figure 3H:
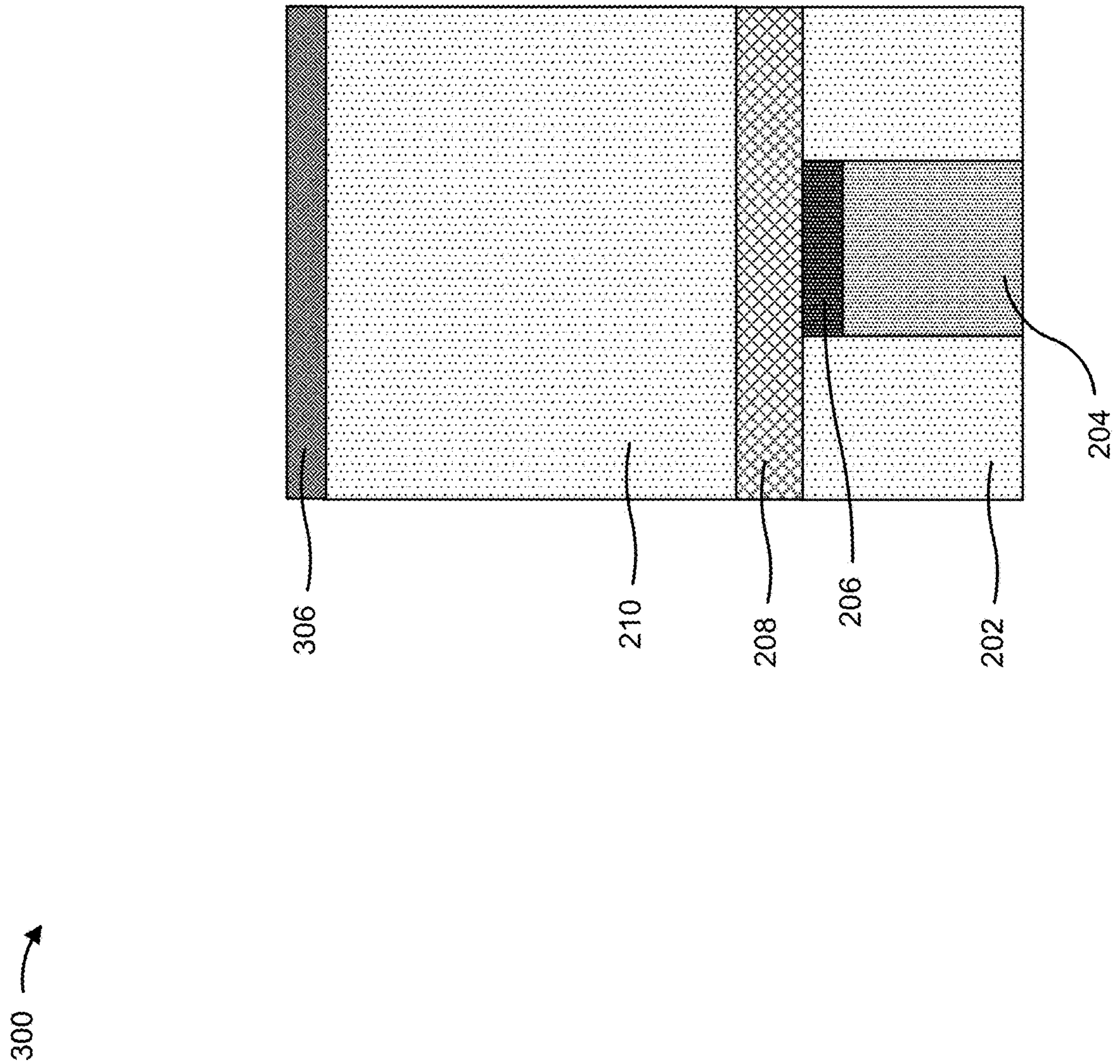

As shown in FIG. 3H, the semiconductor device 200 may include a hydrophobic material 306 or another material that restricts deposition of metal plug material on the upper surface of the third dielectric layer 210. In some implementations, a deposition tool (e.g., deposition tool 102) may deposit the hydrophobic material 306 on the third dielectric layer 210 (e.g., on an upper surface of the third dielectric layer 210). In some implementations, the deposition tool may use chemical vapor deposition or physical vapor deposition, among other examples, to deposit the hydrophobic material 306 on the third dielectric layer 210. In some implementations, the third dielectric layer 210 includes the hydrophobic material 306 or another material that restricts deposition of metal plug material on an upper surface of the third dielectric layer 210. For example, the third dielectric layer 210 may be configured to not bond with metal plug material deposited recess a bottom-up metal-on-metal deposition, such as an area-selective thin film deposition (e.g., a chemical vapor deposition or an atomic layer deposition, among other examples). In these implementations, the deposition tool may deposit the hydrophobic material 306 by depositing the third dielectric layer 210 on the second dielectric layer 208.

Figure 3I:
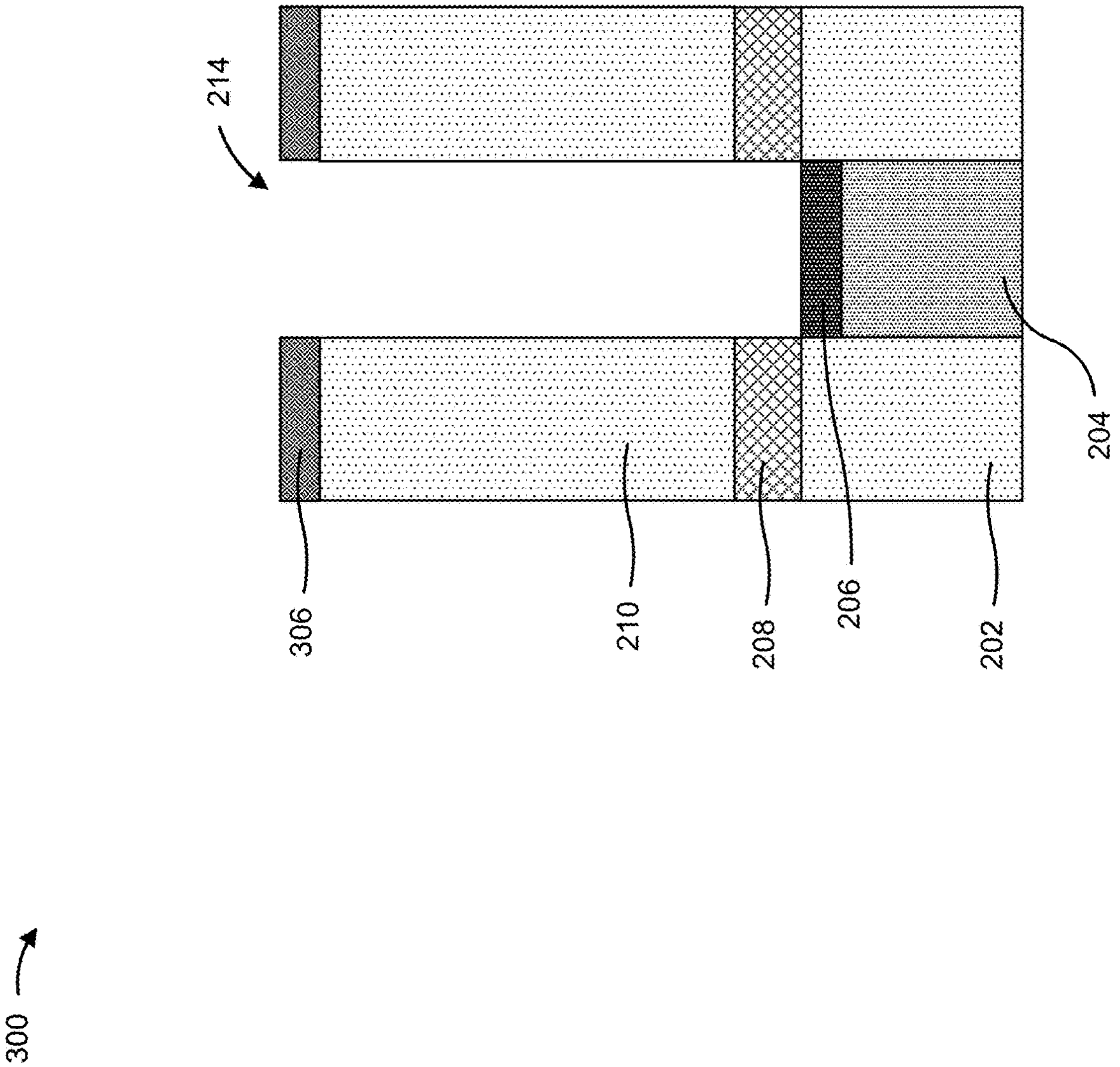

As shown in FIG. 3I, the semiconductor device 200 may include a recess 214 within the second dielectric layer 208 and/or within the third dielectric layer 210. In some implementations, an etching tool (e.g., etching tool 104) may etch a portion of the second dielectric layer 208 and/or the third dielectric layer 210 to form the recess 214. For example, the etching tool may use a wet etching operation, a dry etching operation, and/or another type of etching operation to form the recess 214 within the second dielectric layer 208 and/or the third dielectric layer 210. In some implementations, the etching tool may use a CESL-based etching process in which the etching tool performs an etching operation until detecting the second dielectric layer 208 as the CESL or the metal cap 206 as the CESL. For example, the etching tool may begin etching the second dielectric layer 208 and/or the third dielectric layer 210 and may continue etching until detecting the CESL. In this way, the etching tool may remove material of the second dielectric layer 208 and/or the third dielectric layer 210, but may stop removing material before reaching the first conductive structure 204. In some implementations, the etching tool may remove all material above the metal cap 206 to expose the upper surface of the metal cap 206 within the recess 214.

Figure 3J:
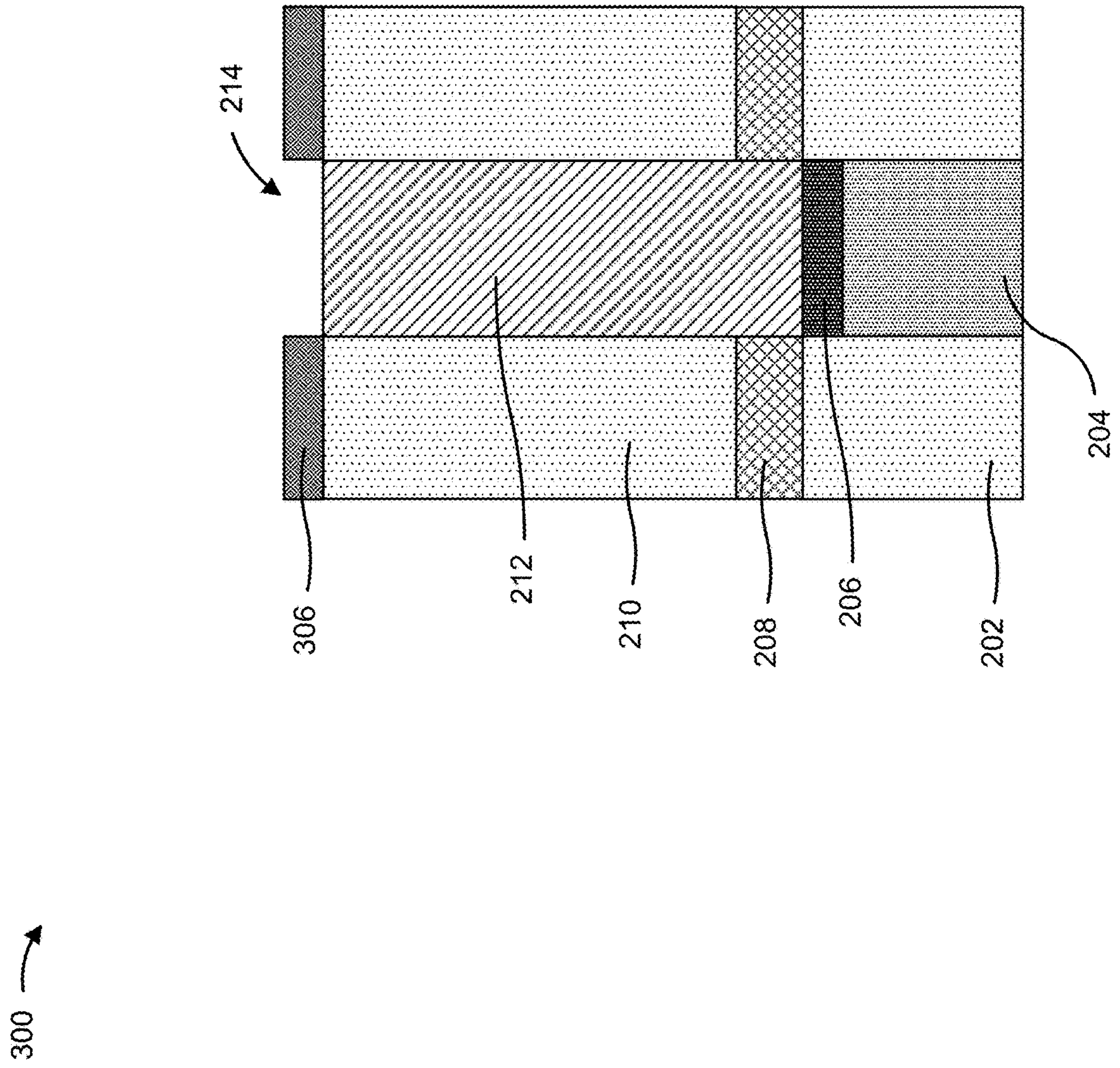

As shown in FIG. 3J, the semiconductor device 200 may include a second conductive structure 212. In some implementations, a deposition tool (e.g., deposition tool 102) may deposit the second conductive structure 212 on the metal cap 206 within the recess 214 formed within the second dielectric layer 208 and/or the third dielectric layer 210. In some implementations, the deposition tool may use a bottom-up metal-on-metal deposition process to deposit the second conductive structure 212. In some implementations, the one or more semiconductor processing tools may perform an operation on the metal cap 206 to prepare the upper surface of the metal cap 206 to receive the metal plug material. The deposition tool may deposit the metal plug material on the metal cap 206 using an area-selective thin film deposition chemical vapor deposition to form the metal plug material directly on the metal cap 206. In some implementations, the area-selective thin film deposition may include a chemical vapor deposition or an atomic layer deposition, among other examples, to deposit the second conductive structure 212 directly on the metal cap 206 and/or directly on sidewalls of the recess 214. For example, the second conductive structure 212 may be in direct contact with the second dielectric layer 208 and/or the third dielectric layer 210 without being separated by a metal liner, a barrier layer, a nucleation layer, or a metal coating layer, among other examples. Based in part on the second conductive structure 212 being in direct contact with one or more of the dielectric layers, the metal plug may have a width that is greater than if a layer of other material separates the second conductive structure 212 from the one or more dielectric layers. In this way, the second conductive structure 212 may provide electrical contact to the metal cap 206 and/or the first conductive structure 204 with a reduced resistance (e.g., based on avoiding or reducing voids and having a greater width).

Figure 3K:
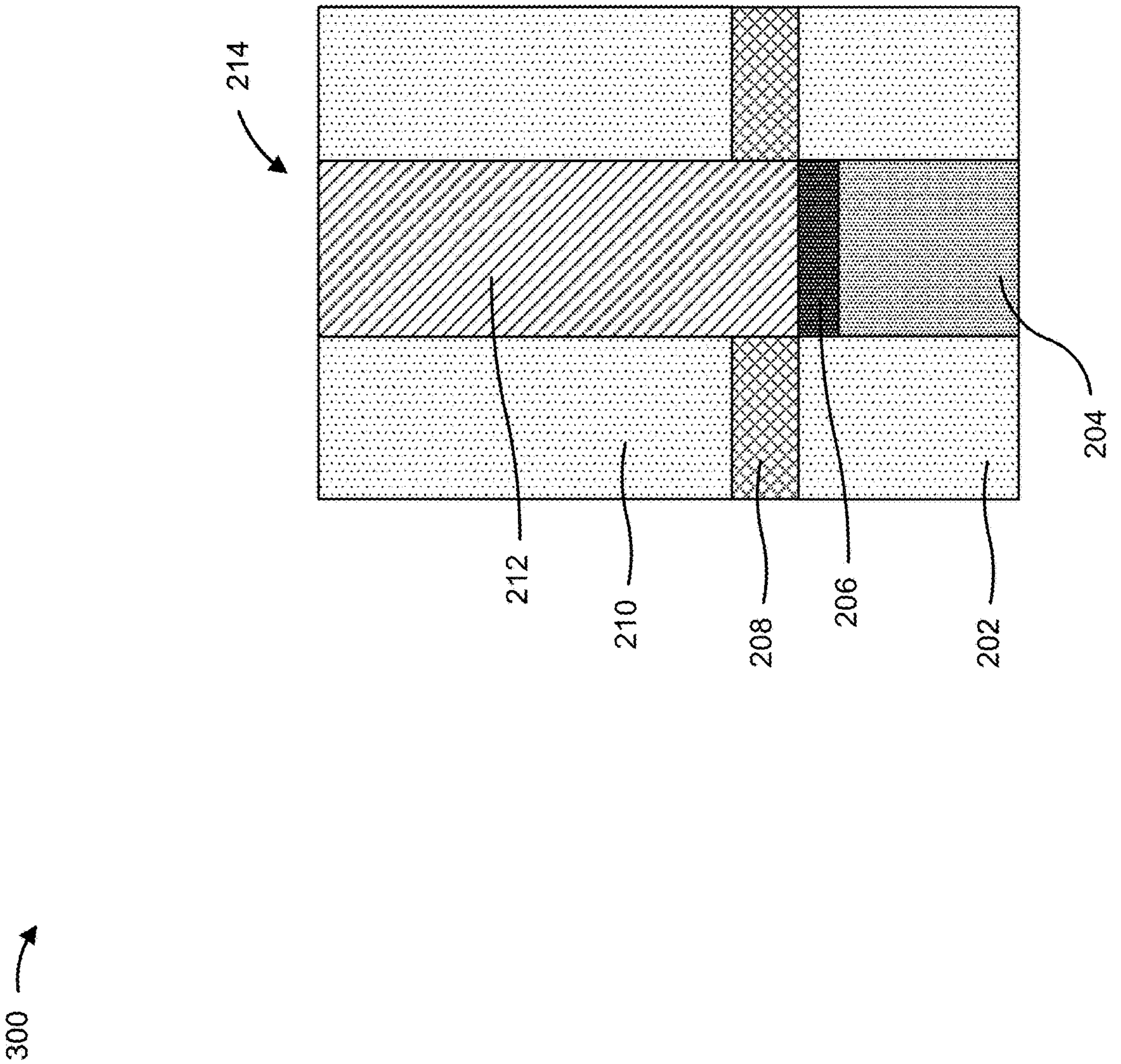

As shown in FIG. 3K, the semiconductor device 200 may no longer include the hydrophobic material 306 or other material that restricts deposition of metal plug material on the upper surface of the third dielectric layer 210. In some implementations, an etching tool (e.g., etching tool 104) may etch the hydrophobic material 306 from the upper surface of the third dielectric layer 210. For example, the etching tool may use a wet etching operation, a dry etching operation, and/or another type of etching operation to form the recess 304 within the first conductive structure 204.

In some implementations, a planarization tool (e.g., planarization tool 106) may planarize an upper surface of the second conductive structure 212. In this way, an upper surface of the second conductive structure 212 may be generally level. This may improve deposition of additional layers on the upper surface of the second conductive structure 212. In some implementations, the planarization tool may be used to remove the hydrophobic material 306 or other material that restricts deposition of metal plug material on the upper surface of the third dielectric layer 210. For example, the planarization tool may remove the hydrophobic material 306, to planarize the upper surface of the second conductive structure 212, and/or to planarize an upper surface of the third dielectric layer 210 in one or more operations (e.g., in a single operation).

As indicated above, FIGS. 3A-3K are provided as an example. Other examples may differ from what is described with regard to FIGS. 3A-3K. The number and arrangement of devices, layers, and/or materials shown in FIGS. 3A-3K are provided as an example. In practice, there may be additional devices, layers, and/or materials, fewer devices, layers, and/or materials, different devices, layers, and/or materials, or differently arranged devices, layers, and/or materials than those shown in FIGS. 3A-3K. For example, the semiconductor device 200 may omit the metal cap 206 and the second conductive structure 212 may be deposited directly on the first conductive structure 204. Additionally, or alternatively, one or more dielectric layers may be deposited as a single dielectric layer.

Figure 4A:
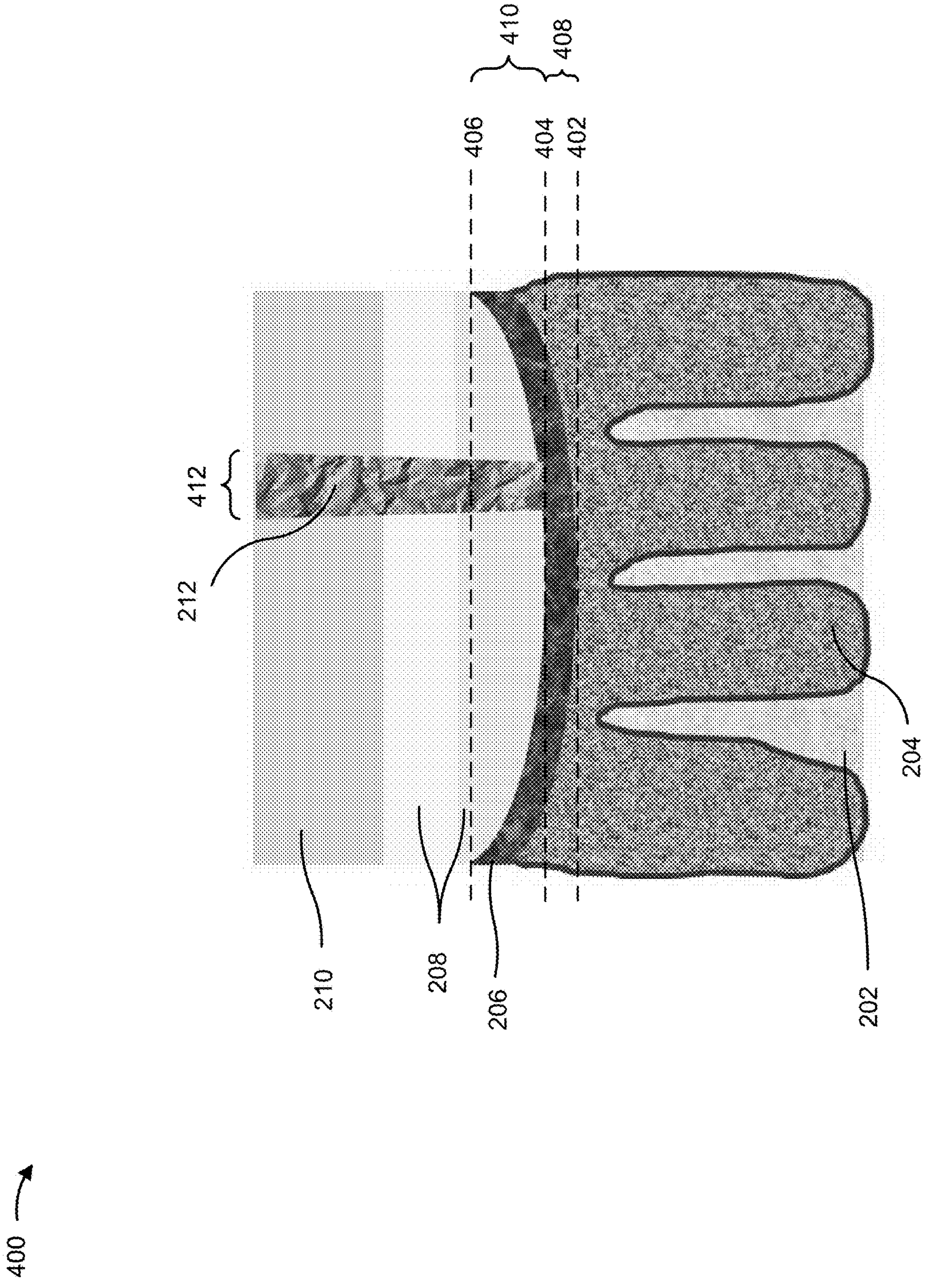
FIGS. 4A-4C are diagrams of example semiconductor devices described herein.
Figure 4B:
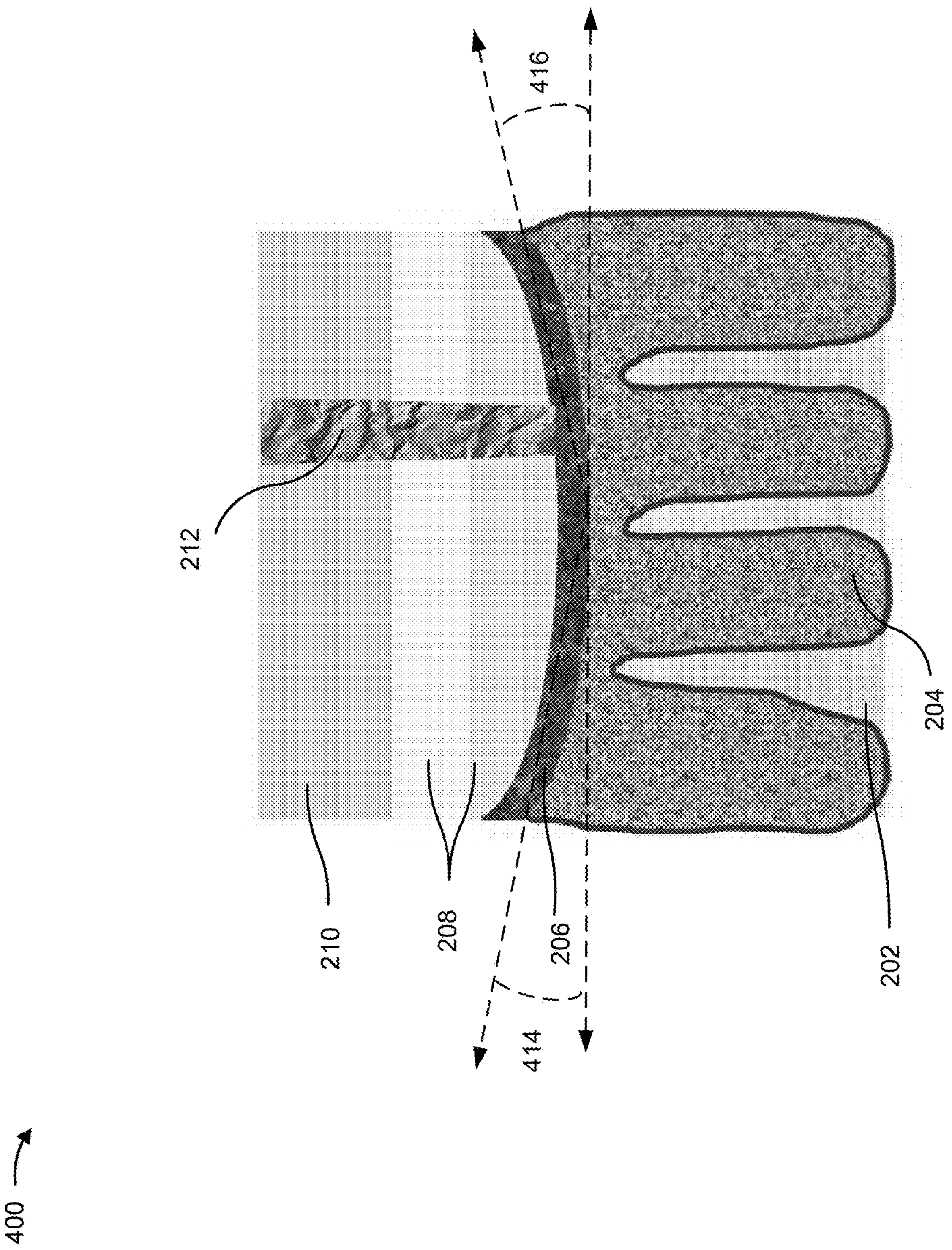
Figure 4C:
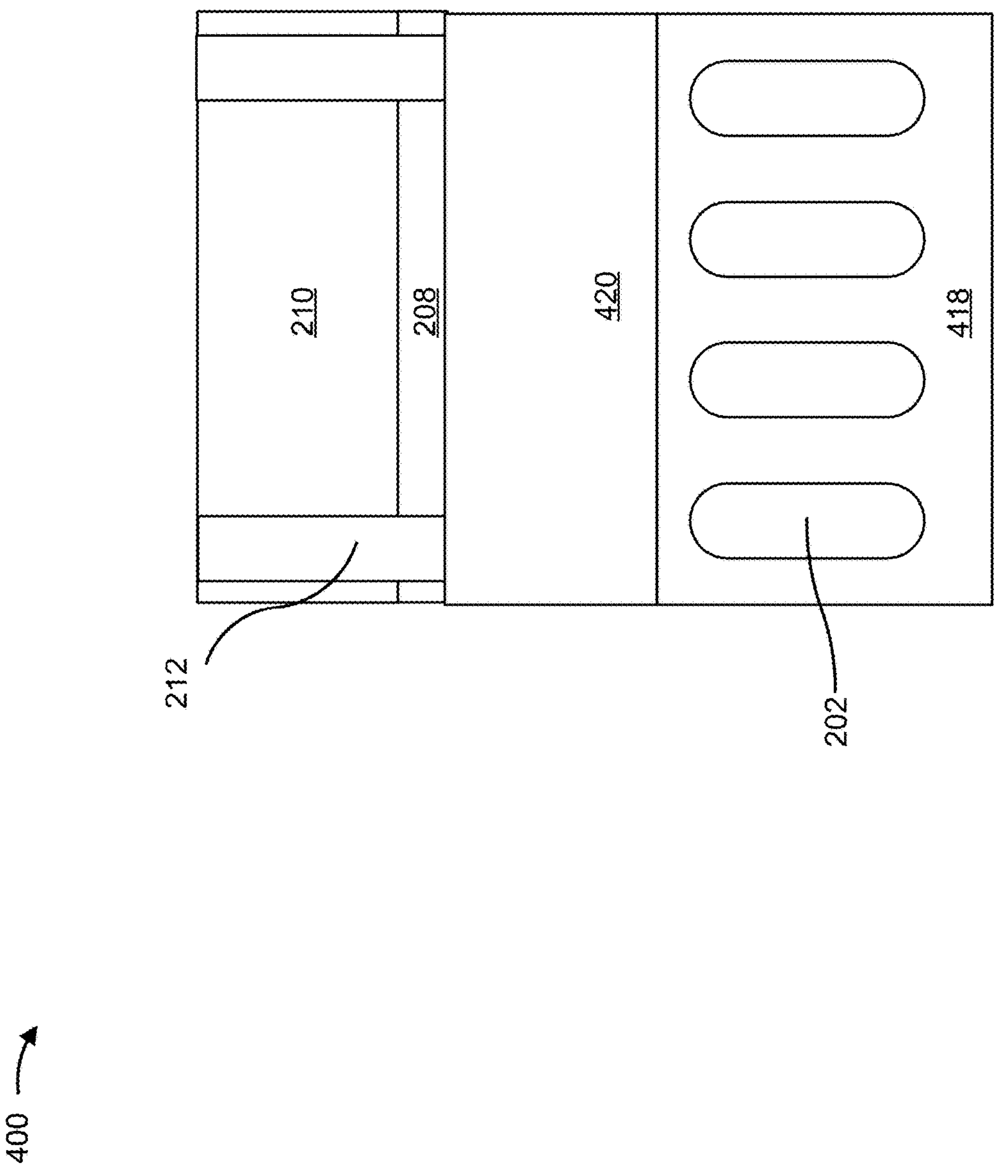

FIGS. 4A-4C are diagrams of an example semiconductor device 400 described herein. The semiconductor device 400 may include, or may be included in, a memory device (e.g., a static random-access memory cell) or a logic device, among other example devices. In some implementations, the semiconductor device 400 may include one or more layers not shown in FIG. 4A or 4B, such as one or more metal gates, a substrate, one or more metal interconnects, one or more recesses, or one or more additional semiconductor devices, among other examples. In some implementations, the semiconductor device 400 may include an example of semiconductor device 200 and/or the semiconductor device 200 may include an example of semiconductor device 400.

As shown in FIG. 4A, the semiconductor device 400 may include a first dielectric layer 202 and a first conductive structure 204 disposed within one or more recesses of the first dielectric layer 202. In some implementations, the first dielectric layer 202 may include one or more fins extending upward into the first conductive structure 204. In some implementations, the first the first dielectric layer 202 may include a fin structure that extends along a first direction (e.g., shown as a lateral direction in FIGS. 4A and 4B). In some implementations, an upper surface of the first conductive structure 204 may have a generally concave shape.

The semiconductor device 400 may include a metal cap 206 on an upper surface of the first conductive structure 204. In some implementations, an upper surface of the metal cap 206 may have a generally concave shape.

The semiconductor device 400 may include one or more portions of a second dielectric layer 208 disposed on the upper surface of the metal cap 206 and a third dielectric layer 210 disposed on an upper surface of the second dielectric layer 208. The semiconductor device 400 may include a second conductive structure 212 disposed within a recess formed within the second dielectric layer 208 and the third dielectric layer 210. The second conductive structure 212 may be disposed directly on the metal cap 206 (e.g., without a liner or a barrier layer, among other examples) and/or in direct contact with the second dielectric layer 208 and/or the third dielectric layer 210.

The metal cap 206 may have a lower surface with a generally convex shape (e.g., extending downward into the first conductive structure 204. The lower surface may be at a height 402 at a lowest portion of the metal cap 206. The upper surface may be at a height 404 at the lowest portion of the metal cap 206. The metal cap 206 may have a thickness 408 at the lowest portion of the metal cap 206. In some implementations, the thickness 408 may be generally uniform across the metal cap 206. In some implementations, the metal cap may have a thickness 408 in a range from approximately 1 nanometer to approximately 6 nanometers. In this way, the metal cap 206 may be thick enough to disperse current through the metal cap 206, and may be thin enough to maintain a low contact resistance between the first metal structure 204 and the second conductive structure 212. If the thickness 408 is greater than 6 nanometers, a manufacturing cost increases without significant benefits, in some instances.

The upper surface of the metal cap 206 may be at a height 406 at a highest portion, and/or an end, of the metal cap 206. In some implementations, a difference 410 between the height 404 and the height 406 may be in a range from approximately 2 nanometers to approximately 10 nanometers. In this way, the difference 410 may be small enough to allow for the bottom-up metal-on-metal deposition of the second conductive structure 212 on the metal cap 206 with a tolerable amount of misalignment (e.g., a tolerable amount of variance from an upward direction).

The second conductive structure 212 may have a width 412 that is in a range from approximately 10 nanometers to approximately 16 nanometers. If the width 412 is greater than 16 nanometers, a process window of subsequent operation steps decreases, in some instances. If the width 412 is smaller than 10 nanometers, electrical resistance of the second conductive structure 212 increases, in some instances In some implementations, the second conductive structure 212 may have a width 412 that is less than approximately 13 nanometers. Based in part on depositing the second conductive structure 212 directly on the metal cap 206 (e.g., using bottom-up metal-on-metal deposition), the second conductive structure 212 may conserve power resources of the semiconductor device 200 that may otherwise be consumed by a metal plug deposited with a metal liner and/or a barrier layer into a recess a width that is in a range from approximately 10 nanometers to approximately 16 nanometers and/or that is less than approximately 13 nanometers.

In some implementations, the second conductive structure 212 may have a thickness, in another dimension (e.g., not shown in FIG. 4A), that is in a range from approximately 10 nanometers to approximately 40 nanometers and/or is less than approximately 13 nanometers. In some implementations, the second conductive structure 212 may have a height in a range from approximately 25 nanometers to approximately 40 nanometers. In some implementations, a deposition technique that includes deposition of a metal liner and/or a barrier layer may be unable to fill the recess 214, without voids and/or causing excessive resistivity, having a height in a range from approximately 25 nanometers to approximately 40 nanometers and a width in at least one direction that is less than approximately 16 nanometers and/or less than approximately 13 nanometers.

In some implementations, the second conductive structure 212 may bond with material of the second dielectric layer 208 and/or the third dielectric material. In some implementations, a thickness of a bonding region may be in a range from approximately 1 nanometer to approximately 4 nanometers. For example, material of a tungsten plug 212 may bond with silicon of the second dielectric layer 208 and/or the third dielectric layer 210 to form a tungsten silicide material (e.g., tungsten disilicide) and/or a tungsten-silicate (e.g., tungsten metasilicate).

As shown in FIG. 4B, the metal cap 206 may have a first curvature angle 414 (e.g., an angle from a lowest height of a lower surface of the metal cap 206 to a highest height of the lower surface of the metal cap 206) to a first side and may have a second curvature angle 416 to a second side. In some implementations, the first curvature angle 414 and the second curvature angle 416 may be in a range from approximately 5 degrees to approximately 30 degrees. In some implementations, a difference between the first curvature angle 414 and the second curvature angle 416 may be in a range from approximately 0 degrees to approximately 20 degrees. In this way, a curvature of the upper surface of the metal cap 206 may be sufficiently symmetric to allow for the bottom-up metal-on-metal deposition of the second conductive structure 212 on the metal cap 206 with a tolerable amount of misalignment (e.g., a tolerable amount of variance from an upward direction).

As shown in FIG. 4C, the semiconductor device 400 may include an epitaxial structure 418 and a first dielectric layer 202 disposed between fins of the epitaxial structure 418. The semiconductor device 400 may also include a conductive structure 420 (e.g., a metal drain) disposed on the epitaxial structure 418. In some implementations, the semiconductor device 400 may include a dielectric layer 208 disposed on the conductive structure 420 and/or a dielectric layer 210 disposed above (e.g., directly on) the first dielectric layer 208.

The semiconductor device 400 may further include one or more conductive structures 212 disposed on the conductive structure 420. In some implementations, the one or more conductive structures 212 may be disposed within one or more recesses of the dielectric layer 208 and/or the dielectric layer 210. In some implementations, the one or more conductive structures 212 may extend from an upper surface of the one dielectric layer 208 and/or the dielectric layer 210 to the conductive structure 420 (e.g., to an upper surface of the conductive structure 420). In this way, the one or more conductive structures 212 may provide one or more electrical connections to the conductive structure 420. In some implementations, the one or more conductive structures 212 may include, or may be disposed within, one or more drain vias.

As indicated above, FIGS. 4A-4C are provided as an example. Other examples may differ from what is described with regard to FIGS. 4A-4C.

Figure 5A:
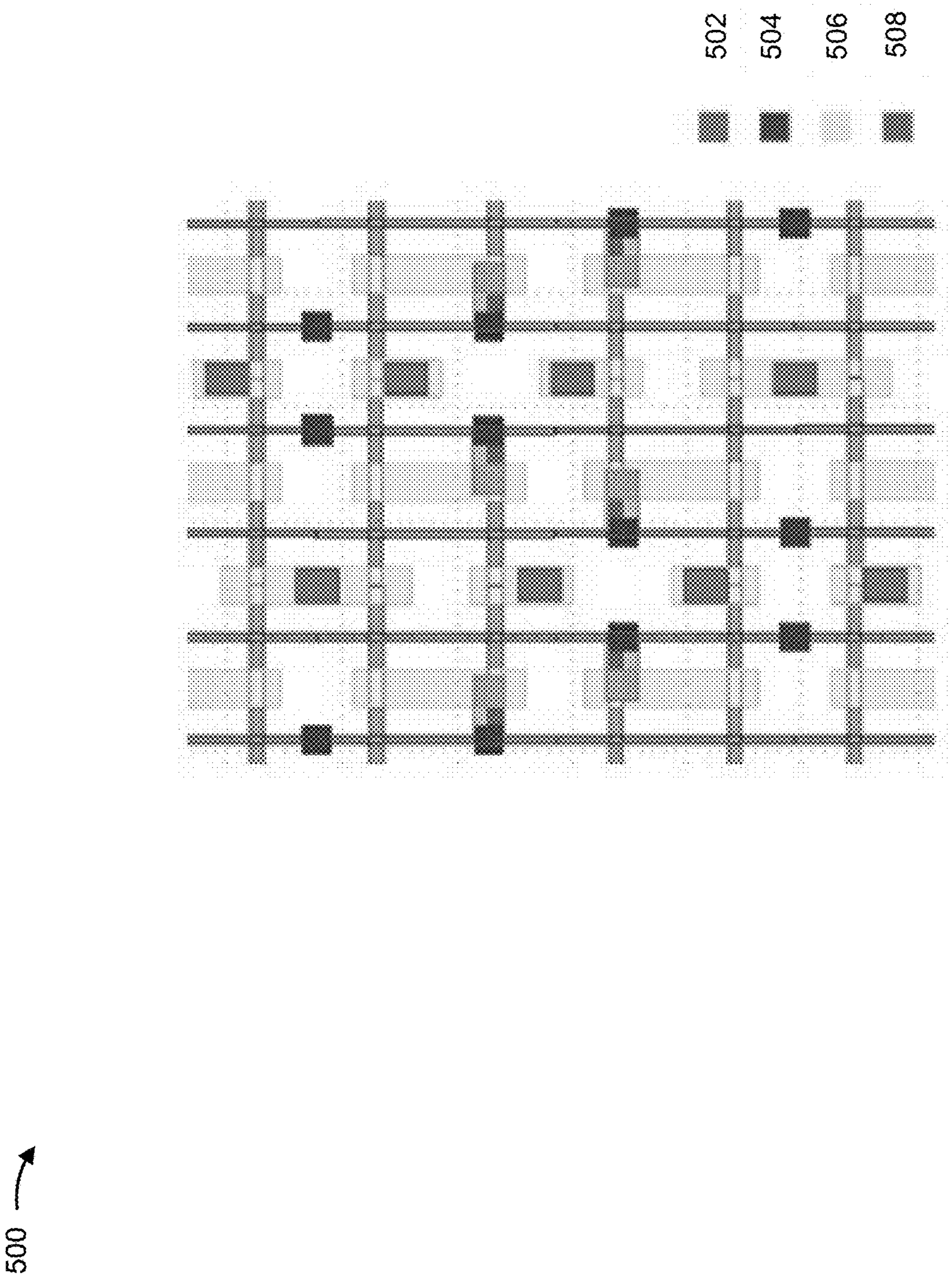
FIGS. 5A and 5B are diagrams of example semiconductor devices described herein
Figure 5B:
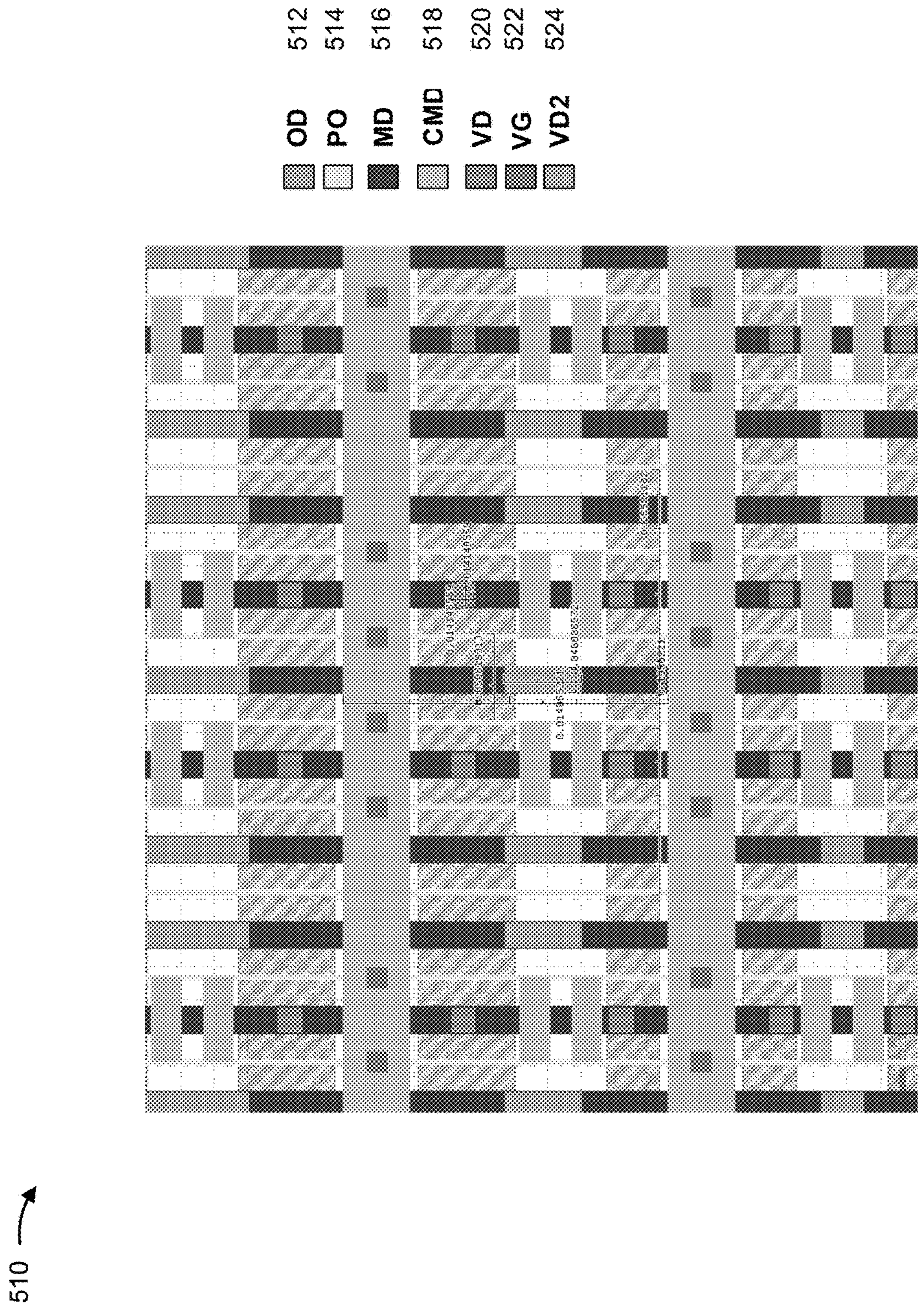

FIGS. 5A and 5B are diagrams of an example semiconductor devices described herein. The semiconductor device 500 (FIG. 5A) may include, or may be included in, a memory device (e.g., a static random-access memory cell), among other example devices. The semiconductor device 510 (FIG. 5B) may include, or may be included in, a logic device, among other example devices. In some implementations, the semiconductor devices 500 and/or 510 may include one or more layers not shown in FIG. 5A or 5B, such as one or more metal gates, a substrate, one or more metal interconnects, one or more recesses, or one or more additional semiconductor devices, among other examples. In some implementations, the semiconductor devices 500 and/or 510 may include an example of semiconductor devices 400 and/or 200 and/or the semiconductor devices 200 and/or 400 may include an example of semiconductor devices 500 and/or 510.

As shown in FIG. 5A, the semiconductor device 500 may include one or more contact recesses 502 to provide an electrical connection to a first set of source/drain contacts of the semiconductor device 500. The semiconductor device 500 may include one or more recesses 504 to provide an electrical connection to one or more gates of the semiconductor device 500. The semiconductor device 500 may include one or more sets of source/drain contacts 506 to receive or drain a voltage from active regions of the semiconductor device 500. The semiconductor device 500 may include one or more recesses 508 to provide an electrical connection to a second set of source/drain contacts 506 of the semiconductor device 500.

In some implementations, the semiconductor device 500 may include a voltage link having a width of approximately 3 nanometers and a pitch (e.g., a length) of approximately 45 nanometers. The semiconductor device 500 may have a fin pitch of approximately 26 nanometers extending into one or more metal gates (not shown) of the semiconductor device 500. In some implementations, bottom-up metal-on-metal deposition of a metal plug may be used for deposition of the one or more recesses 504 (e.g., recess 214 filled with second conductive structure 212) to allow for a reduction in a size of the semiconductor device 500 and/or to improve performance of the semiconductor device 500. For example, the one or more recesses 504 may have a width in a first direction of approximately 12 nanometers and in a second direction of approximately 12 nanometers.

As shown in FIG. 5B, the semiconductor device 510 may include one or more active regions 512 of the semiconductor device 510. The semiconductor device 510 may include one or more voltage lines 514 to receive a voltage to apply to one or more elements of the semiconductor device 510. The semiconductor device 510 may include one or more source/drain contacts 516 to provide an electrical connection to one or more sources and/or drains of the semiconductor device 510. The semiconductor device 510 may include one or more metal layers 518 to provide electrical connections between different layers of the semiconductor device 510. The semiconductor device 510 may include a first set of one or more contact recesses 520 to provide an electrical connection to a first set of source/drain contacts of the semiconductor device 510. The semiconductor device 510 may include one or more recesses 522 to provide an electrical connection to one or more gates of the semiconductor device 510. The semiconductor device 510 may include a second set of one or more contact recesses 524 to provide an electrical connection to a second set of source/drain contacts of the semiconductor device 510.

In some implementations, one or more active regions 512 of the semiconductor device 510 may have widths of approximately 32 nanometers. In some implementations, the semiconductor device 500 may include a voltage link having a width of approximately 3 nanometers and a pitch (e.g., a length) of approximately 45 nanometers or approximately 51 nanometers. The one or more source/drain contacts 516 may have widths of approximately 16 nanometers (e.g., 16 by 16 nanometers). The one or more contact recesses 520 may have widths of approximately 14 nanometers (e.g., 14 by 14 nanometers) and the one or more contact recesses 524 may have dimensions of approximately 15 by 25 nanometers, 15 by 46 nanometers, or 15 by 67 nanometers.

In some implementations, bottom-up metal-on-metal deposition of a metal plug may be used for deposition of the one or more recesses 522 (e.g., recess 214 filled with second conductive structure 212) to allow for a reduction in a size of the semiconductor device 510 and/or to improve performance of the semiconductor device 510. For example, the one or more recesses 522 may have a width in a first direction of approximately 12 nanometers and in a second direction of approximately 12 nanometers.

As indicated above, FIGS. 5A and 5B are provided as examples. Other examples may differ from what is described with regard to FIGS. 5A and 5B.

Figure 6:
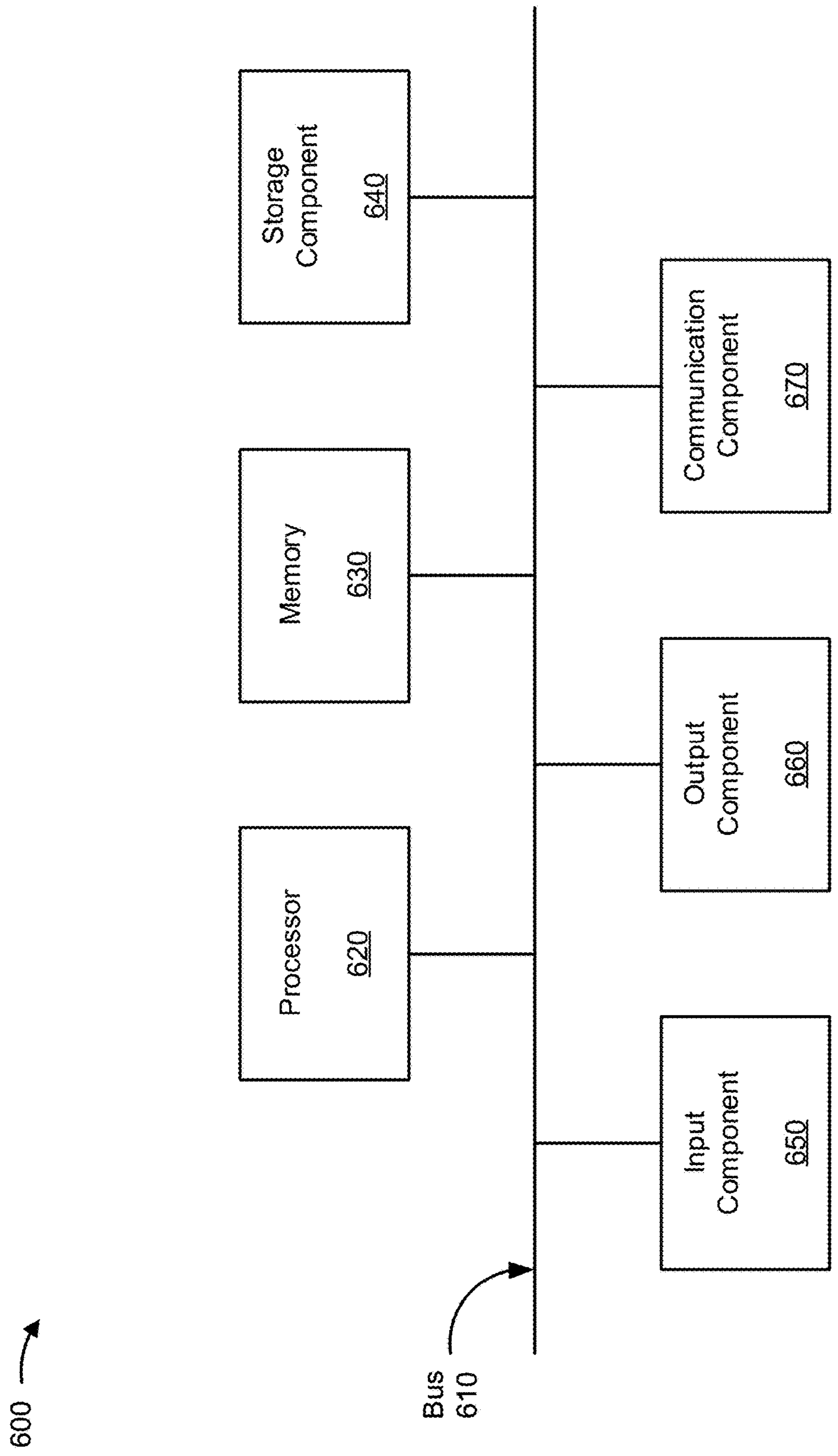
FIG. 6 is a diagram of example components of one or more devices of FIG. 1.

FIG. 6 is a diagram of example components of a device 600, which may correspond to deposition tool 102, etching tool 104, planarization tool 106, and/or wafer/die transport tool 108. In some implementations, deposition tool 102, etching tool 104, planarization tool 106, and/or wafer/die transport tool 108 may include one or more devices 500 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as recess a display, a speaker, and/or one or more light-emitting diodes. Communication component 670 enables device 600 to communicate with other devices, such as recess a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
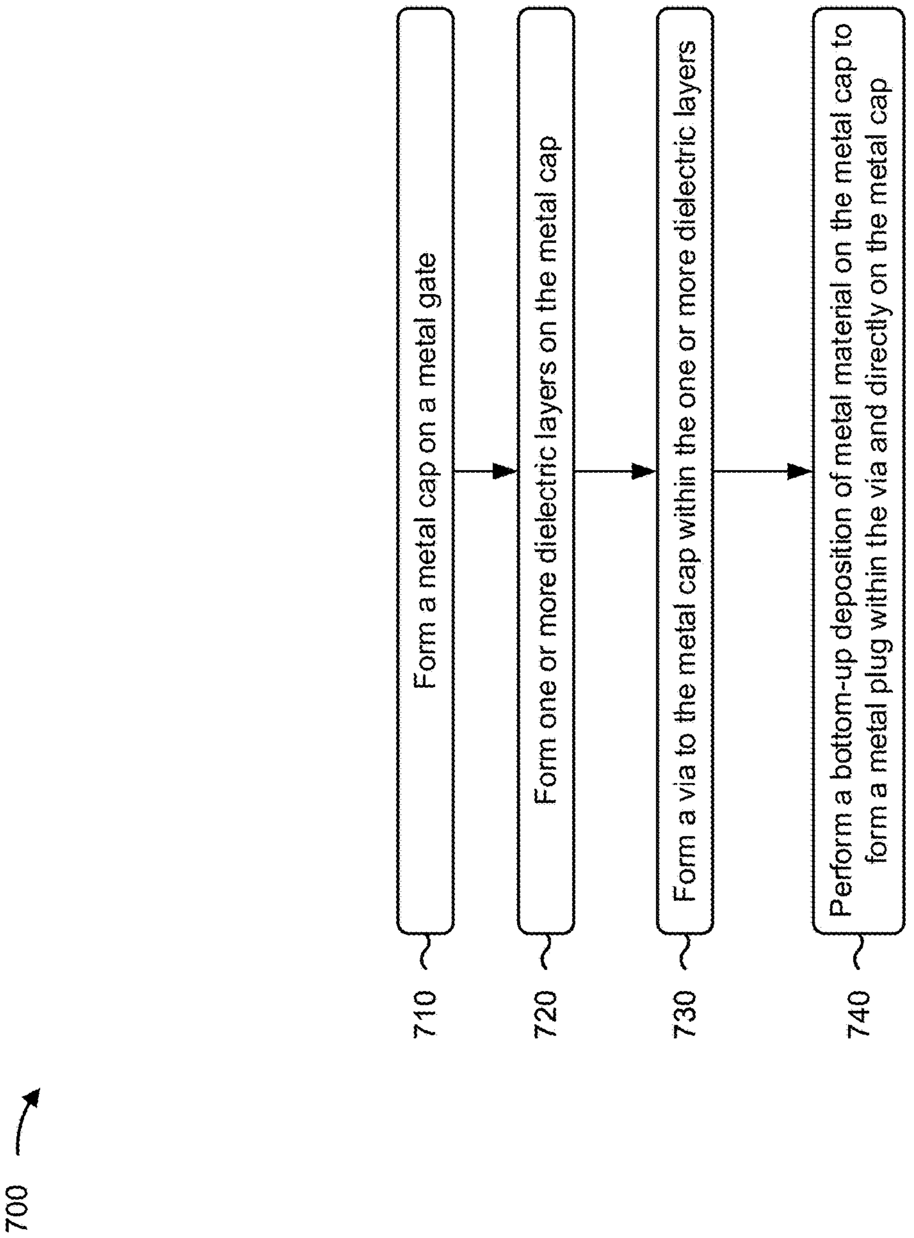
FIG. 7 is a flowchart of an example process relating to forming a semiconductor device.

FIG. 7 is a flowchart of an example process 700 associated with a CESL with low-hydrogen concentration for a pixel sensor. In some implementations, one or more process blocks of FIG. 7 may be performed by one or more semiconductor processing tools (e.g., deposition tool 102, etching tool 104, planarization tool 106, and/or wafer/die transport tool 108). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include depositing a metal cap on a first conductive structure (block 710). For example, the one or more semiconductor processing devices may deposit a metal cap 206 on a first conductive structure 204, as described above.

As further shown in FIG. 7, process 700 may include depositing one or more dielectric layers on the metal cap (block 720). For example, the one or more semiconductor processing devices may deposit one or more dielectric layers 208 and/or 210 on the metal cap 206, as described above.

As further shown in FIG. 7, process 700 may include partially removing a portion of the one or more dielectric layers to form a recess (block 730). For example, the one or more semiconductor processing devices may partially remove a portion of the one or more dielectric layers 208 and/or 210 to form a recess 214, as described above.

As further shown in FIG. 7, process 700 may include performing a bottom-up deposition of a same metallic material of the metal cap to form a second conductive structure within the recess and directly on the metal cap (block 740). For example, the one or more semiconductor processing devices may perform a bottom-up deposition of a same metallic material of the metal cap 206 to form a second conductive structure 212 within the recess 214 and directly on the metal cap 206, as described above.

Process 700 may include additional implementations, such as any single implementation or any combination of implementations described below and/or in connection with one or more other processes described elsewhere herein.

In a first implementation, depositing the one or more dielectric layers on the metal cap includes depositing an etch stop layer, and partially removing the portion of the one or more dielectric layers comprises etching the one or more dielectric layers until detecting the etch stop layer.

In a second implementation, alone or in combination with the first implementation, performing the bottom-up deposition of metal material on the metal cap comprises selectively growing the metallic material from the metal cap.

In a third implementation, alone or in combination with one or more of the first and second implementations, selectively growing the metallic material comprises one or more of performing a chemical vapor deposition, or performing an atomic layer deposition.

In a fourth implementation, alone or in combination with one or more of the first through third implementations, selectively growing the metallic material comprises selectively etching the metallic material and selectively depositing the metallic material in an alternating sequence.

In a fifth implementation, alone or in combination with one or more of the first through fourth implementations, process 700 includes depositing, before forming the metal plug, a hydrophobic material on the one or more dielectric layers.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
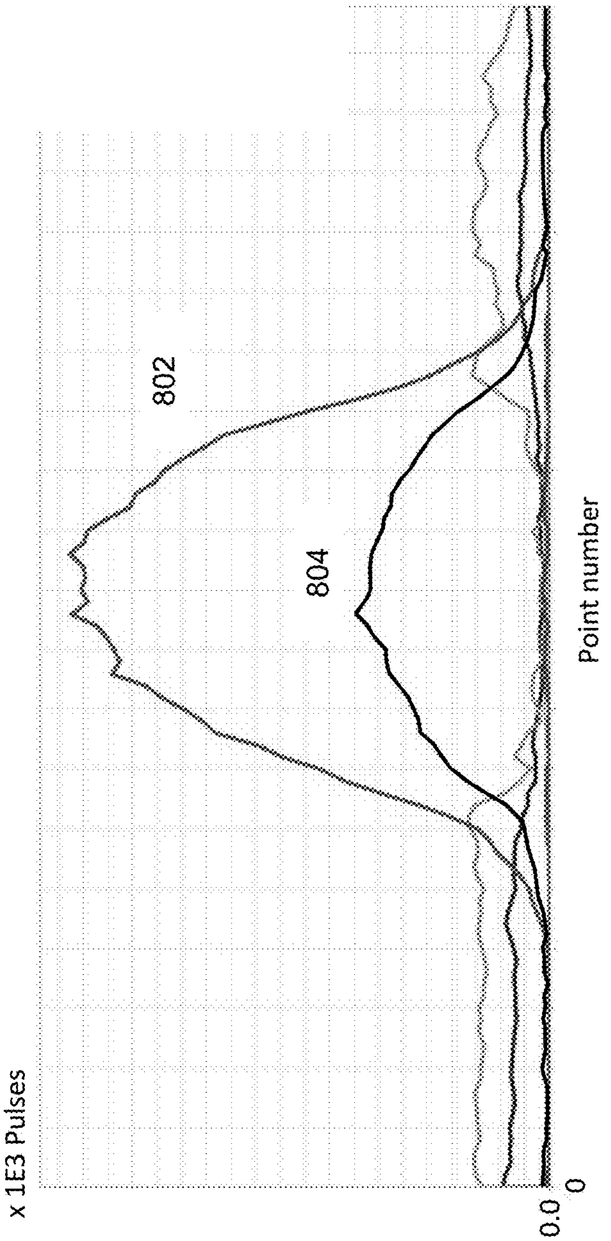
FIG. 8 is a diagram of example data graph described herein.

FIG. 8 is a diagram of example data graph 800 described herein. The data graph 800 shows numbers of different types of atoms and/or molecules (y-axis). The data graph 800 also shows different lateral positions (x-axis) of a conductive structure 212 as described herein. As shown, in the data graph 800, the conductive structure includes a first material 802 (e.g., tungsten) and a second material 804 (e.g., tantalum). In some implementations, a concentration of the second material 804 (e.g., tantalum) at a middle portion of the conductive structure 212 (e.g., a tungsten-based structure) is greater than a concentration of the second material 804 at a lateral edge of the conductive structure 212. In some implementations, the conductive structure 212 has a width that is less than approximately 13 nanometers.

As indicated above, FIG. 8 is provided as an example. Other examples may differ from what is described with regard to FIG. 8.

In this way (e.g., based on using bottom-up metal-on-metal deposition of a metal plug within a recess), the recess may be filled with the metal plug without the need for a metal liner and/or a barrier layer. Additionally, or alternatively, the metal plug may be formed without voids or with reduced voids. In this way, a width of the recess may be decreased (e.g., to less than 16 nanometers or to less than 13 nanometers) while maintaining a sufficient width of metal plug material to maintain a relatively low resistivity of an interface between the metal plug and the metal gate. Further, a manufacturing timing and/or cost may be reduced based on not depositing the metal liner and/or the barrier layer.

As described in greater detail above, some implementations described herein provide a semiconductor device. The semiconductor device includes a metal gate. The semiconductor device includes a metal cap disposed on the metal gate. The semiconductor device includes a metal plug disposed within a recess and directly on the metal cap and directly on sidewalls of the recess.

As described in greater detail above, some implementations described herein provide a method. The method includes forming a metal cap on a metal gate. The method includes forming one or more dielectric layers on the metal cap. The method includes forming a recess to the metal cap within the one or more dielectric layers. The method includes performing a bottom-up deposition of metal material on the metal cap to form a metal plug within the recess and directly on the metal cap.

As described in greater detail above, some implementations described herein provide a semiconductor device. The semiconductor device includes a metal gate. The semiconductor device includes a metal cap disposed on the metal gate. The semiconductor device includes one or more dielectric layers disposed above the metal cap. The semiconductor device includes a recess extending through the one or more dielectric layers to the metal cap. The semiconductor device includes a tungsten plug disposed within the recess and directly on the metal cap and in direct contact with the one or more semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- depositing a metal cap on a first conductive structure in a first dielectric layer, wherein an upper surface of the metal cap is coplanar with an upper surface of the first dielectric layer, and wherein an entire surface of sidewalls of the metal cap is surrounded by the first dielectric layer;
- depositing one or more second dielectric layers on the metal cap;
- partially removing a portion of the one or more second dielectric layers to form a recess; and
- performing a bottom-up deposition of a metallic material of the metal cap to form a second conductive structure within the recess and directly on the metal cap, wherein a width of the second conductive structure is equal to a width of the first conductive structure.

2. The method of claim 1,
wherein depositing the one or more second dielectric layers on the metal cap includes:
depositing an etch stop layer, and
wherein partially removing the portion of the one or more second dielectric layers comprises:
etching the one or more second dielectric layers until detecting the etch stop layer.

3. The method of claim 1,
wherein performing the bottom-up deposition comprises:
selectively growing the metallic material of the metal cap.

4. The method of claim 3, wherein selectively growing the metallic material comprises one or more of: performing a chemical vapor deposition, or performing an atomic layer deposition.

5. The method of claim 3, wherein selectively growing the metallic material comprises: selectively etching the metallic material, and depositing the metallic material, in an alternating sequence.

6. The method of claim 1, further comprising: depositing, before forming the second conductive structure, a hydrophobic material on the one or more second dielectric layers.

7. A method, comprising: depositing a first conductive structure in a recess of a first dielectric layer; depositing a metal cap on the first conductive structure, wherein an upper surface of the metal cap is coplanar with an upper surface of the first dielectric layer, wherein the metal cap substantially overlaps an entire top surface of the first conductive structure, and wherein an entire surface of sidewalls of the metal cap is surrounded by the first dielectric layer; depositing a second dielectric layer on the first dielectric layer and on the metal cap; depositing a third dielectric layer on the second dielectric layer; and forming a second conductive structure on the metal cap, wherein a width of the second conductive structure is equal to a width of the first conductive structure.

8. The method of claim 7, wherein the sidewalls of the metal cap are aligned with sidewalls of the first conductive structure.

9. The method of claim 8, wherein sidewalls of the second conductive structure are in direct contact and aligned with the sidewalls of the metal cap.

10. The method of claim 7, wherein forming the second dielectric layer on the first dielectric layer comprises: depositing the second dielectric layer on the first dielectric layer and the metal cap, and removing a portion of the second dielectric layer that resides on the metal cap, wherein the second dielectric layer resides outside of the metal cap.

11. The method of claim 7, wherein the second conductive structure is formed within the third dielectric layer.

12. The method of claim 7, further comprising: depositing a hydrophobic material on the third dielectric layer.

13. A method, comprising: forming a recess in a first dielectric layer; forming a first conductive structure in the recess; depositing a metal cap on the first conductive structure and within the recess, wherein an upper surface of the metal cap is coplanar with an upper surface of the first dielectric layer, wherein sidewalls of the metal cap are aligned with sidewalls of the first conductive structure, and wherein an entire surface of the sidewalls of the metal cap is surrounded by the first dielectric layer; forming a second dielectric layer on the first dielectric layer and around the metal cap; and forming a second conductive structure on the metal cap and in the second dielectric layer, wherein sidewalls of the second conductive structure are in direct contact and aligned with the sidewalls of the metal cap, wherein a width of the second conductive structure is equal to a width of the first conductive structure, and wherein an upper surface of the second conductive structure resides above an upper surface the second dielectric layer.

14. The method of claim 13, wherein the second conductive structure is formed using a bottom-up metal-on-metal deposition.

15. The method of claim 14, wherein the bottom-up metal-on-metal deposition comprises selectively growing a metallic material of the metal cap to form the second conductive structure.

16. The method of claim 13, wherein the metal cap comprises one or more of: a titanium-based material, a cobalt-based material, a nickel-based material, a ruthenium-based material, a tantalum-based material, a tungsten-based material, and a platinum-based material.

17. The method of claim 13, wherein the second conductive structure has a width that is less than approximately 13 nanometers.

18. The method of claim 13, wherein the second conductive structure includes a tungsten-based structure.

19. The method of claim 18, wherein a concentration of tungsten at a lower portion of the tungsten-based structure is smaller than a concentration of tungsten at an upper portion of the tungsten-based structure.

20. The method of claim 13, wherein forming the second dielectric layer comprises: depositing the second dielectric layer on the first dielectric layer and the metal cap; and removing a portion of the second dielectric layer on the metal cap.

* * * * *